United States Patent
Song et al.

(10) Patent No.: US 12,020,742 B2
(45) Date of Patent: Jun. 25, 2024

(54) COMPENSATING FOR CONCENTRATED ACTIVATION OF MEMORY CELLS IN A SEMICONDUCTOR MEMORY DEVICE

(71) Applicant: SAMSUNG ELECTRONICS CO., LTD., Suwon-si (KR)

(72) Inventors: Won-Hyung Song, Osan-si (KR); Jung Min You, Hwaseong-si (KR); Seong-Jin Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 96 days.

(21) Appl. No.: 17/734,508

(22) Filed: May 2, 2022

(65) Prior Publication Data
US 2023/0066757 A1 Mar. 2, 2023

(30) Foreign Application Priority Data
Aug. 24, 2021 (KR) ........................ 10-2021-0111938

(51) Int. Cl.
| | |
|---|---|
| *G11C 11/401* | (2006.01) |
| *G11C 11/4072* | (2006.01) |
| *G11C 11/408* | (2006.01) |
| *G11C 11/4091* | (2006.01) |
| *G11C 11/4093* | (2006.01) |
| *G11C 11/4096* | (2006.01) |

(52) U.S. Cl.
CPC ...... *G11C 11/4072* (2013.01); *G11C 11/4085* (2013.01); *G11C 11/4087* (2013.01); *G11C 11/4091* (2013.01); *G11C 11/4093* (2013.01); *G11C 11/4096* (2013.01)

(58) Field of Classification Search
CPC ............ G11C 11/4072; G11C 11/4085; G11C 11/4087; G11C 11/4091; G11C 11/4093; G11C 11/4096
See application file for complete search history.

(56) References Cited

U.S. PATENT DOCUMENTS

| | | |
|---|---|---|
| 7,262,983 B2 | 8/2007 | Sekiguichi et al. |
| 9,659,621 B2 | 5/2017 | Seo et al. |
| 9,747,971 B2 | 8/2017 | Bains et al. |
| 10,082,586 B2 | 9/2018 | Kosai |
| 10,861,530 B2 | 12/2020 | Yamada et al. |
| 11,594,297 B2 | 2/2023 | Di Vincenzo et al. |

(Continued)

FOREIGN PATENT DOCUMENTS

| | | |
|---|---|---|
| KR | 10-0884160 | 2/2009 |
| KR | 10-2019-0124895 | 11/2019 |

(Continued)

OTHER PUBLICATIONS

Yoongu Kim et al., "Flipping Bits in Memory Without Accessing Them: An Experimental Errors", ISCA, 2014.

*Primary Examiner* — Mushfique Siddique
(74) *Attorney, Agent, or Firm* — F. Chau & Associates, LLC

(57) ABSTRACT

Disclosed is a method for accessing memory cells arranged in rows and columns. The method includes activating a specific row of the rows of the memory cells, and flipping data bits stored in memory cells of the specific row in response to determining that concentrated activation occurs at the specific row.

18 Claims, 16 Drawing Sheets

(56) References Cited

U.S. PATENT DOCUMENTS

| | | | |
|---|---|---|---|
| 2015/0363264 A1* | 12/2015 | Cai .......................... | G11C 7/02 |
| | | | 714/6.11 |
| 2018/0307434 A1 | 10/2018 | Bittlestone | |
| 2019/0333583 A1 | 10/2019 | Byun | |
| 2020/0012600 A1 | 1/2020 | Konoth et al. | |
| 2021/0042407 A1 | 2/2021 | Choi et al. | |
| 2021/0406384 A1* | 12/2021 | Jin ........................... | G11C 7/24 |
| 2022/0148646 A1* | 5/2022 | Noguchi ........... | G11C 11/40622 |
| 2023/0121199 A1* | 4/2023 | Cho .................... | G11C 11/4076 |
| | | | 365/185.21 |
| 2023/0206988 A1* | 6/2023 | Ayyapureddi ......... | G11C 29/52 |
| | | | 365/185.04 |

FOREIGN PATENT DOCUMENTS

| | | |
|---|---|---|
| KR | 10-2133573 | 7/2020 |
| KR | 10-2021-0017241 | 2/2021 |
| TW | 202131325 | 8/2021 |

* cited by examiner

COMPENSATING FOR CONCENTRATED ACTIVATION OF MEMORY CELLS IN A SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2021-0111938 filed on Aug. 24, 2021, in the Korean Intellectual Property Office, the disclosure of which is incorporated by reference in its entirety herein.

1. TECHNICAL FIELD

Embodiments of the present disclosure described herein relate to an electronic device, and more particularly, relate to a method for preventing loss of data in adjacent memory rows when certain memory cell rows are frequently activated, and a semiconductor memory device performing the method.

2. DISCUSSION OF RELATED ART

A semiconductor memory device may include memory cells arranged in rows and columns. When activating or accessing a specific row of the memory cells, a voltage change may occur at the memory cells in the specific row. The voltage change may cause stress to memory cells in a row adjacent to the specific row. This stress may cause data stored in the adjacent row to be lost or changed.

SUMMARY

Embodiments of the present disclosure provide a method and a semiconductor memory device capable of compensating for or suppressing a stress coming from concentrated activation of memory cells in a specific row, and an operating method of a memory controller including the same.

According to an embodiment, a method for accessing memory cells arranged in rows and columns includes activating a specific row of the rows of the memory cells, and flipping data bits stored in memory cells of the specific row in response to determining that concentrated activation occurs at the specific row.

According to an embodiment, a semiconductor memory device includes pads that are connected with an external device, a memory cell array that includes memory cells arranged in rows and columns, a sense amplifier that is connected with the columns of the memory cells through bit lines, a row decoder that is connected with the rows of the memory cells through word lines, a buffer circuit that is connected between the sense amplifier and the pads, and control logic. In response to determining that an active command is received, the row decoder activates one of the rows of the memory cells, and the sense amplifier stores data bits of memory cells of the activated row. In response to determining that concentrated activation occurs at the activated row, the control logic controls the semiconductor memory device such that the data bits of the memory cells of the activated row, which are stored in the sense amplifier, are flipped.

According to an embodiment, a memory system includes a semiconductor memory device that includes memory cells arranged in rows and columns, and a memory controller that transmits a row address and an active command to the semiconductor memory device. The semiconductor memory device activates a row corresponding to the row address from among the rows of the memory cells in response to the active command, and the semiconductor memory device flips data bits stored in memory cells of the activated row in response to determining that concentrated activation occurs at the activated row.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one of skill in the art may implement embodiments of the invention. The term "and/or" as used hereinafter is intended to include any one of items listed with regard to the term, or a combination of some of the listed items.

Figure 1:
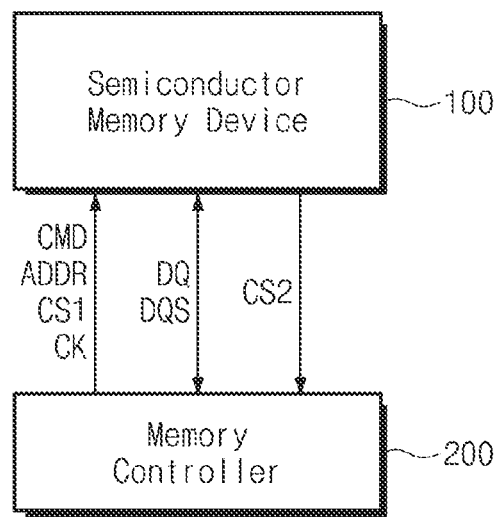
FIG. 1 illustrates a memory system according to an embodiment of the present disclosure.

FIG. 1 illustrates a memory system 10 according to an embodiment of the present disclosure. Referring to FIG. 1, the memory system 10 may include a semiconductor memory device 100 and a memory controller 200.

The semiconductor memory device 100 may include at least one of various memories such as a static random access memory (SRAM), a dynamic random access memory (DRAM), a phase-change RAM (PRAM), a magnetic RAM (MRAM), a ferroelectric RAM (FeRAM), and a resistive RAM (RRAM).

The semiconductor memory device 100 may be implemented with a memory module including two or more memory packages. For example, the memory module may be implemented based on a dual in-line memory module (DIMM). As another example, the semiconductor memory device 100 may be implemented with an embedded memory that is directly mounted on a board of an electronic device.

The memory controller 200 may access the semiconductor memory device 100 depending on a request of an external host device (e.g., a central processing unit or an application processor). For example, the memory controller 200 may provide the semiconductor memory device 100 with a command CMD, an address ADDR, a first control signal CS1, and a clock signal CK. The memory controller 200 may receive a second control signal CS2 from the semiconductor memory device 100.

The memory controller 200 may exchange a data signal DQ and a data strobe signal DQS with the semiconductor memory device 100, based on the command CMD, the address ADDR, the first control signal CS1, the clock signal CK, and the second control signal CS2. The data strobe signal DQS may be a toggle signal indicating a timing to latch the data signal DQ.

Figure 2:
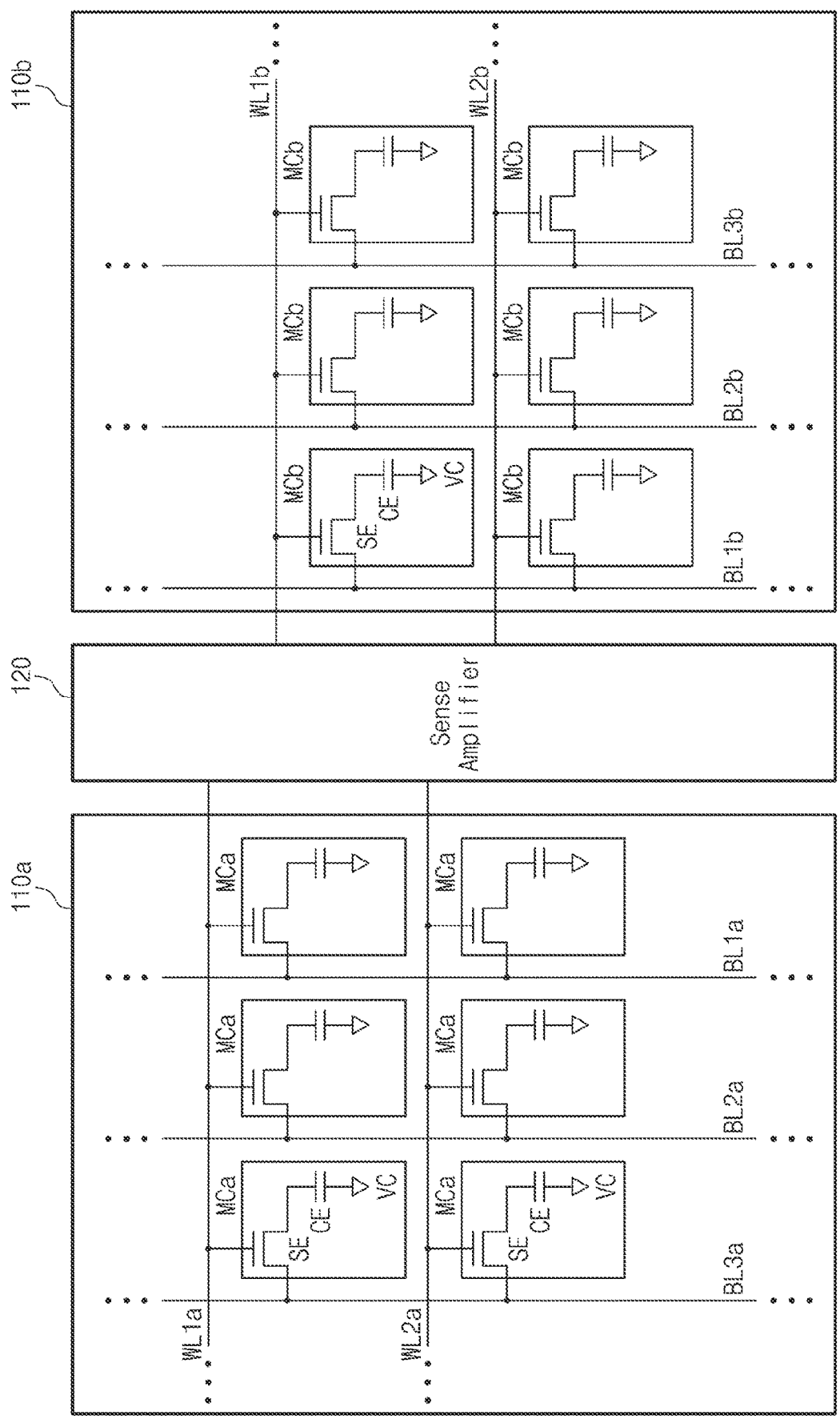
FIG. 2 illustrates a memory cell array according to an embodiment of the present disclosure.

FIG. 2 illustrates memory cell arrays 110a and 110b and a sense amplifier 120 according to an embodiment of the present disclosure. The memory cell arrays 110a and 110b may be included in the semiconductor memory device 100. An example in which the memory cell arrays 110a and 110b are included in the semiconductor memory device 100 implemented with a DRAM is illustrated as an embodiment. However, the present disclosure is not limited to the example in which the memory cell arrays 110a and 110b are included in the semiconductor memory device 100 implemented with a DRAM.

Referring to FIG. 2, the memory cell array 110a may include memory cells MCa arranged in rows and columns, and the memory cell array 110b may include memory cells MCb arranged in rows and columns. The rows of the memory cells MCa may be connected with word lines WL1a and WL2a. The rows of the memory cells MCb may be connected with word lines WL1b and WL2b. The columns of the memory cells MCa may be connected with bit lines BL1a, BL2a, and BL3a. The columns of the memory cells MCb may be connected with bit lines BL1b, BL2b, and BL3b. In an embodiment, a row may be understood as having the same meaning as a word line or a meaning similar thereto. While 4 word lines, 6 bit lines, and 12 memory cells are illustrated in FIG. 2, the number of word lines, the number of bit lines, and the number of memory cells are not limited thereto.

The memory cell arrays 110a and 110b may be implemented with a pair. The word lines WL1a and WL2a may be paired with the word lines WL1b and WL2b, respectively. For example, when the word line WL1a is activated, the paired word line WL1b may also be activated together. Likewise, the bit lines BL1a, BL2a, and BL3a may be paired with the bit lines BL1b, BL2b, and BL3b respectively. Paired bit lines may be driven in association with each other.

In another example, the memory cell arrays 110a and 110B are not paired. Hereinafter, based on the context, the terms "word line" and "bit line" may refer to a pair of lines implemented as a pair or one line not implemented as a pair. Also, depending on the context, the terms "row" and "column" may refer to a pair of rows implemented as a pair, a pair of columns implemented as a pair, a row not implemented as a pair, and a column not implemented as a pair. Likewise, depending on the context, the term "memory cell" may refer to a pair of memory cells or one memory cell not implemented as a pair.

The memory cell MCa connected with a specific word line WL2a and a specific bit line BL1a of the memory cell array 110a may store a data bit complementary to that of the memory cell MCb connected with a specific word line WL2b and a specific bit line BL1b of the memory cell array 110a. That is, one data bit may be complementarily stored in a pair of memory cells MCa and MCb.

Each of the memory cells MCa and MCb may include a selection element SE and a capacitance element CE. The selection element SE may operate in response to a voltage of a corresponding word line of the word lines WL1a, WL1b, WL2a, and WL2b. When the corresponding word line (or a voltage of the word line) is activated, the selection element SE may be turned on to electrically connect the capacitance element CE with a corresponding bit line of the bit lines BL1a, BL1b, BL2a, and BL2b. When the corresponding word line (or a voltage of the word line) is deactivated, the selection element SE may be turned off to electrically disconnect the capacitance element CE from the corresponding bit line.

The capacitance element CE may be connected between the selection element SE and a common node to which a common voltage VC is applied. The capacitance element CE may be implemented with a capacitor. The capacitance element CE may store a data bit by storing a voltage transferred from the corresponding bit line through the selection element SE. In an embodiment, the common voltage VC may be a power supply voltage, a ground voltage, or a voltage having a level between the power supply voltage and the ground voltage (e.g., a level corresponding to half the level of the power supply voltage).

When a specific word line (e.g., WL2a and WL2b) is activated, data bits stored in the memory cells MCa and MCb connected with the specific word lines WL2a and WL2b may be read. In this case, a voltage change may occur at the capacitance elements CE of the memory cells MCa and MCb of the activated word lines WL2a and WL2b.

When the activated word lines WL2a and WL2b are deactivated, the data bits may be written in the memory cells MCa and MCb connected with the specific word lines WL2a and WL2b. In this case, a voltage change may occur at the capacitance elements CE of the memory cells MCa and MCb of the activated word lines WL2a and WL2b.

The voltage change occurring at the capacitance elements CE of the memory cells MCa and MCb of the activated word lines WL2a and WL2b may cause a voltage change at the capacitance elements CE of the memory cells MCa and MCb of adjacent neighbor word lines (e.g., WL1a and/or WL1b) due to coupling. The voltage change due to the coupling may act as a stress on the memory cells MCa and MCb of an adjacent row (e.g., WL1a and/or WL1b, or third word lines (not illustrated) adjacent to WL2a and WL2b), and thus may cause an error in data bits. For example, a third row of memory cells MCa connected to a third word line may be located in 110a below the second row of memory cells MCa connected to word line WL2a, and a third row memory cells MCb connected to a third word line may be located in 110b below the second row of memory cells MCb connected to word line WL2b.

When a frequent or concentrated activation is made with respect to the specific word lines WL2a and WL2b, a stress applied to adjacent neighbor word lines (e.g., WL1a and/or WL1b, or the third word lines (not illustrated)) may increase, and thus, the probability that an error occurs may increase.

In an embodiment, a row that causes a stress or an error factor may be referred to as an "aggressor row". In an embodiment, a row that is affected by a stress or an error factor may be referred to as a "victim row".

Figure 3:
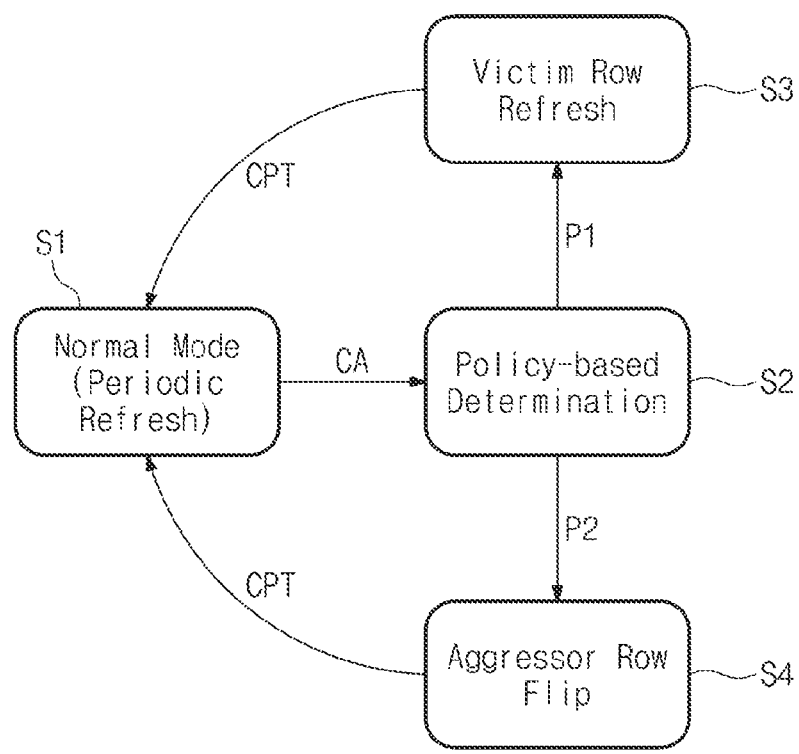
FIG. 3 is illustrates an example in which a memory system operates for the purpose of preventing an error of data bits.

FIG. 3 illustrates an example in which the memory system 10 (e.g., the semiconductor memory device 100 or the memory controller 200) operates for the purpose of preventing an error in data bits. Referring to FIGS. 1, 2, and 3, in a first state S1, the memory system 10 (e.g., the semiconductor memory device 100 or the memory controller 200) may operate in a normal mode. In the normal mode, the memory controller 200 may transmit a refresh command to the semiconductor memory device 100 periodically.

The semiconductor memory device 100 may perform a refresh operation in response to the refresh command. In the refresh operation, data bits may be read from memory cells in a specific row, and the read data bits may be again written therein. As such, the stress (or error factor) accumulated in the memory cells in the specific row may be removed.

In an embodiment, after charges corresponding to a data bit are stored in the capacitance element CE, over time, charges may be leaked out from the capacitance element CE or may be introduced into the capacitance element CE. The charge leakage or introduction may act as a stress on a data bit stored in the capacitance element CE and may be accumulated as an error factor. As charges are again charged (or discharged) to or from the capacitance element CE through the refresh operation, the accumulated stress or error factor may be removed.

In an embodiment, when the memory controller 200 does not access the semiconductor memory device 100 in the normal mode, the memory controller 200 may transmit a self-refresh command to the semiconductor memory device 100. In response to the self-refresh command, the semiconductor memory device 100 may periodically perform the refresh operation without receiving the refresh command from the memory controller 200.

In response to that the concentrated activation CA occurs at a specific row, the memory system 10 (e.g., the semiconductor memory device 100 or the memory controller 200) may enter a second state S2. In the second state S2, the memory system 10 (e.g., the semiconductor memory device 100 or the memory controller 200) may perform policy-based determination. A policy may be determined during initialization of the memory system 10 by an external host device or the memory controller 200.

In the case where the policy of the concentrated activation CA is set to a first policy P1, in response to that the concentrated activation CA occurs at a specific row, the memory system 10 (e.g., the semiconductor memory device 100 or the memory controller 200) may enter a third state S3. In the third state S3, the memory system 10 (e.g., the semiconductor memory device 100 or the memory controller 200) may perform the refresh operation with respect to a victim row.

For example, the memory system 10 (e.g., the semiconductor memory device 100 or the memory controller 200) may remove the stress or error factor accumulated by the concentrated activation CA by performing the refresh operation with respect to the victim row. When the refresh operation is completed (CPT), the memory system 10 (e.g., the semiconductor memory device 100 or the memory controller 200) may return to the first state S1.

In the case where the policy of the concentrated activation CA is set to a second policy P2, in response to that the concentrated activation CA occurs at a specific row, the memory system 10 (e.g., the semiconductor memory device 100 or the memory controller 200) may enter a fourth state S4. In the fourth state S4, the memory system 10 (e.g., the semiconductor memory device 100 or the memory controller 200) may perform a flip operation with respect to an aggressor row.

For example, the memory system 10 (e.g., the semiconductor memory device 100 or the memory controller 200) may compensate for or suppress the stress or error factor coming from the concentrated activation CA by flipping data bits of memory cells in an aggressor row where the concentrated activation CA occurs.

For example, when data bit "1" is stored in a specific memory cell in an aggressor row where the cells concentrated activation CA occurs, memory cells in an adjacent neighbor row may be affected by the following stress or error factor: a voltage of the capacitance element CE increases to the power supply voltage. For example, in the case where data bit "1" stored in a specific memory cell in an aggressor row where the cells concentrated activation CA occurs is inverted into data bit "0", memory cells in an adjacent neighbor row may be affected by the following stress or error factor: a voltage of the capacitance element CE decreases to the ground voltage.

As a data bit of a specific memory cell in an aggressor row where the concentrated activation CA occurs is flipped, the stress or error factor before the flip operation and the stress or error factor after the flip operation may be canceled out. That is, the stress or error factor due to the concentrated activation CA may be compensated for or suppressed.

The policy of the concentrated activation CA may be set to both the first policy P1 and the second policy P2. In this case, the memory system 10 (e.g., the semiconductor memory device 100 or the memory controller 200) may perform both the flip operation associated with an aggressor row where the concentrated activation CA occurs and the refresh operation associated with a victim row.

Figure 4:
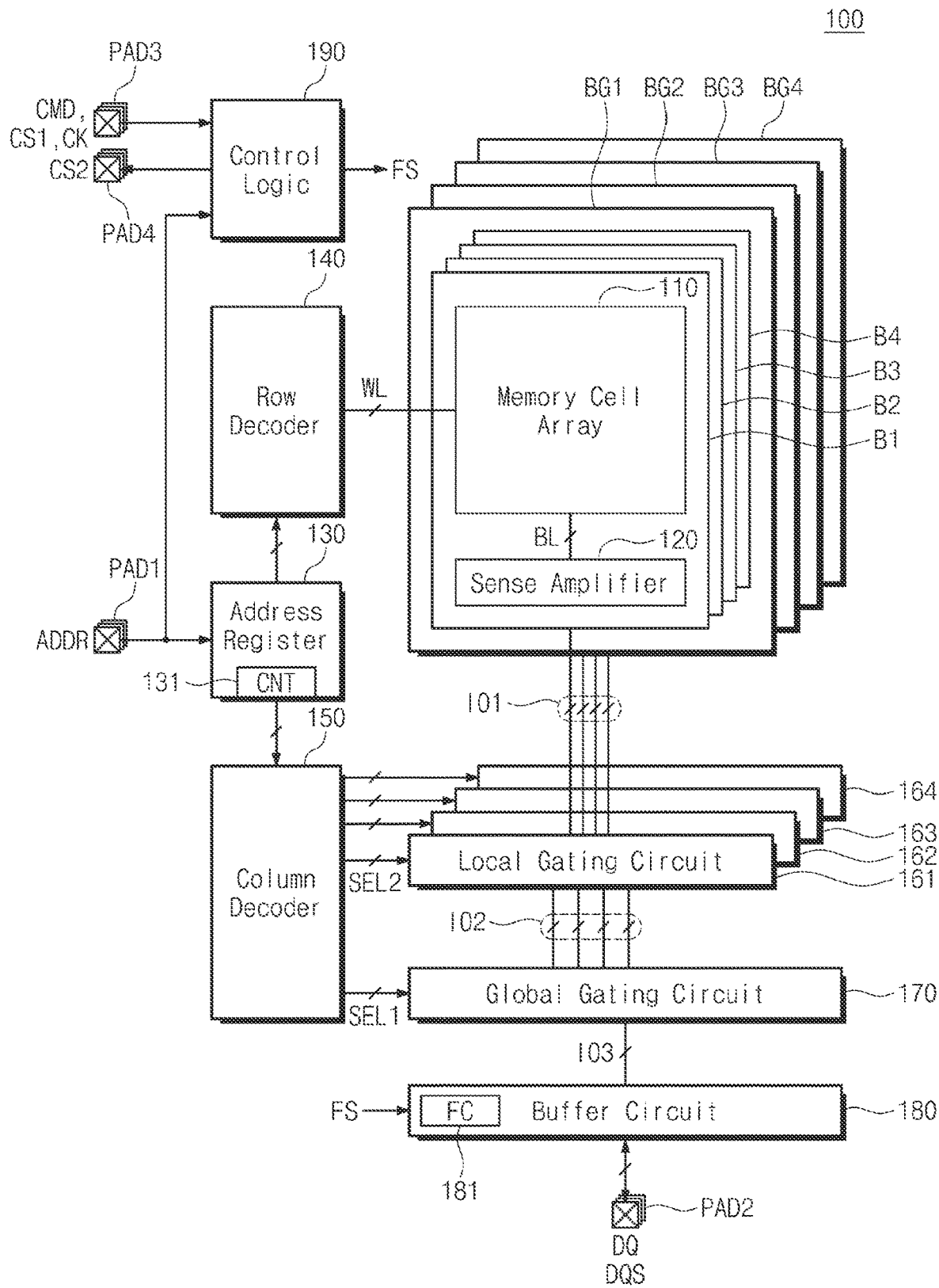
FIG. 4 illustrates a semiconductor memory device according to an embodiment of the present disclosure.

FIG. 4 illustrates the semiconductor memory device 100 according to an embodiment of the present disclosure. Referring to FIGS. 1, 2, 3, and 4, the semiconductor memory device 100 may include first to fourth bank groups BG1 to BG4. The first to fourth bank groups BG1 to BG4 may have the same structures and may operate in the same manner.

Each of the first to fourth bank groups BG1 to BG4 may include first to fourth banks B1 to B4. The first to fourth banks B1 to B4 may have the same structures and may operate in the same manner.

Each of the first to fourth banks B1 to B4 may include the memory cell array 110 and the sense amplifier 120. The memory cell array 110 may include the memory cell arrays 110a and 110b described with reference to FIG. 2. The sense amplifier 120 may be connected with columns of memory cells of the memory cell array 110 through bit lines BL.

The semiconductor memory device 100 may further include an address register 130, a row decoder 140 (e.g., a decoder circuit), a column decoder 150 (e.g., decoder circuit), first to fourth local gating circuits 161, 162, 163, and 164, a global gating circuit 170, a buffer circuit 180, and control logic 190 (e.g., a logic circuit).

The address register 130 may receive the address ADDR from the memory controller 200 through first pads PAD1. The address ADDR may include a bank group address, a bank address, a row address, and a column address. The address register 130 may transfer the bank group address, the bank address, and the row address to the row decoder 140. The address register 130 may transfer the bank group address, the bank address, and the column address to the column decoder 150.

The address register 130 may include a counter (CNT) 131. The counter 131 may count up (e.g., increment) or down (e.g., decrement) the row address or the column address and may internally generate row addresses or column addresses increasing or decreasing sequentially.

The row decoder 140 may receive the bank group address, the bank address, and the row address from the address register 130. The row decoder 140 may select one of the first to fourth bank groups BG1 to BG4, based on the bank group address. The row decoder 140 may select one of the first to fourth banks B1 to B4 in the selected bank group, based on the bank address. The row decoder 140 may select one word line (or a pair of word lines) of word lines of the selected bank in the selected bank group, for example, one row (or a pair of rows) of rows of memory cells, based on the row address.

The row decoder 140 may activate the selected row by applying a voltage for turning on the selection element SE to the selected row of the selected bank in the selected bank group. After the selected word line is activated, an access to data bits of the memory cells in the selected row may be permitted.

The row decoder 140 may deactivate the selected row by applying a voltage for turning off the selection element SE to the selected row of the selected bank in the selected bank group. After the selected row is deactivated, the activation of any other row may be permitted.

The column decoder 150 may receive the bank group address, the bank address, and the column address from the address register 130. The column decoder 150 may generate first selection signals SEL1, based on the bank group address. The column decoder 150 may provide the first selection signals SEL1 to the global gating circuit 170.

The column decoder 150 may generate second selection signals SEL2, based on the bank address and the column address. The column decoder 150 may provide the second selection signals SEL2 to the first to fourth local gating circuits 161, 162, 163, and 164.

The first to fourth local gating circuits 161, 162, 163, and 164 may correspond to the first to fourth bank groups BG1, BG2, BG3, and BG4, respectively. The first to fourth local gating circuits 161, 162, 163, and 164 may be connected with the first to fourth bank groups BG1, BG2, BG3, and BG4 through first input and output lines IO1.

The first input and output lines IO1 may include first to fourth bank group lines connected with the first to fourth bank groups BG1, BG2, BG3, and BG4. For example, the first bank group lines may include first to fourth bank lines connected with the first to fourth banks B1, B2, B3, and B4, and the second bank group lines may include first to fourth bank lines connected with the first to fourth banks B1, B2, B3, and B4. Likewise, the third bank group lines may include first to fourth bank lines connected with the first to fourth banks B1, B2, B3, and B4, and the fourth bank group lines may include first to fourth bank lines connected with the first to fourth banks B1, B2, B3, and B4. The first to fourth bank group lines of the first input and output lines IO1 are illustrated in FIG. 4 as an example.

Each of the first to fourth local gating circuits 161, 162, 163, and 164 may select one of banks belonging to the corresponding one of the first to fourth bank groups BG1, BG2, BG3, and BG4. For example, the first local gating circuit 161 may be connected with the first to fourth banks of the first bank group BG1 through the first to fourth bank lines of the first bank group lines included in the first input and output lines IO1.

The first local gating circuit 161 may select ones of the first to fourth bank lines (e.g., may select one bank) in response to corresponding selection signals of the second selection signals SEL2. The first local gating circuit 161 may electrically connect the selected bank lines (or bank) with corresponding lines of second input and output lines IO2 (e.g., with global lines to be described later).

Likewise, in the second to fourth bank groups BG2, BG3, and BG4, like the first local gating circuit 161, each of the second to fourth local gating circuits 162, 163, and 164 may select one bank and may electrically connect the selected bank with corresponding lines of the second input and output lines IO2 (e.g., with global lines to be described later).

The global gating circuit 170 may be connected with the first to fourth local gating circuits 161, 162, 163, and 164 through the second input and output lines IO2. The second input and output lines IO2 may include first to fourth global lines connected with the first to fourth local gating circuits 161, 162, 163, and 164. The first to fourth global lines of the second input and output lines IO2 are illustrated in FIG. 4 as an example.

The global gating circuit 170 may select ones of the first to fourth bank lines (e.g., may select one bank group) in response to the first selection signals SEL1. The global gating circuit 170 may electrically connect the selected global lines (or a selected bank of a selected bank group) with third input and output lines IO3.

The buffer circuit 180 may be electrically connected with the third input and output lines IO3. The buffer circuit 180 may be connected with the memory controller 200 through second pads PAD2. The buffer circuit 180 may exchange the data signal DQ and the data strobe signal DQS with the memory controller 200 through the second pads PAD2.

The buffer circuit 180 may transmit the data signal DQ (i.e., data bits), which is received from the memory controller 200 through the second pads PAD2 in synchronization with the data strobe signal DQS, to the sense amplifier 120 of the selected bank in the selected bank group through the global gating circuit 170 and the selected local gating circuit of the first to fourth local gating circuits 161, 162, 163, and 164.

The buffer circuit 180 may output data bits, which are transferred from the sense amplifier 120 of the selected bank in the selected bank group through the selected local gating circuit of the first to fourth local gating circuits 161, 162, 163, and 164 and the global gating circuit 170, to the memory controller 200 through the second pads PAD2.

The buffer circuit 180 may include a flip circuit (FC) 181. The flip circuit 181 may receive a flip signal FS from the control logic 190. In response to the flip signal FS, the flip circuit 181 may selectively flip the data bits transferred through the buffer circuit 180. For example, in response to that the flip signal FS has a first value, the flip circuit 181 does not flip the data bits transferred through the buffer circuit 180. In response to that the flip signal FS has a second value, the flip circuit 181 inverts the data bits transferred through the buffer circuit 180. For example, data bits to be written to the memory cell array 100 when the flip signal FS has the second value are inverted to generate inverted data, and the inverted data is then written to the memory cell array 100.

The control logic 190 may receive the command CMD, the first control signal CS1, and the clock signal CK from the memory controller 200 through third pads PAD3. The control logic 190 may receive the address ADDR from the memory controller 200 through the first pads PAD1. The control logic 190 may receive the second control signal CS2 from the memory controller 200 through fourth pads PAD4.

As a portion of an algorithm for preventing an error of data bits stored in the memory cells MCa and MCb, the control logic 190 may enter the first state S1. In the first state S1, in response to that a refresh command is received as the command CMD, the control logic 190 may allow the counter 131 to generate a row address internally. Under control of the control logic 190, the semiconductor memory device 100 may perform the refresh operation based on a row address generated by the counter 131.

The control logic 190 may monitor the command CMD and the address ADDR. By monitoring the command CMD and the address ADDR, the control logic 190 may determine (or detect) whether a concentrated activation CA occurs at a specific row. For example, in response to that an active command and a row address are received, the control logic 190 may store the row address. The control logic 190 may detect the concentrated activation CA by counting the number of times that the active command is received with regard to a specific row address. For example, if the active command for a specific row is received a number of times that exceeds a threshold number, then it may be determined that the concentrated activation CA has occurred.

As another example, the control logic 190 may count the number of times that a specific row is activated, by counting the number of times that the active command is received with regard to a specific row address, during a given time window (e.g., a time period). The control logic 190 may detect the concentrated activation CA by counting the number of times that a specific row is activated. For example, if the specific row is activated a number of times during the given time window that exceeds a threshold number, then it may be determined that the concentrated activation CA has occurred.

In response to that the concentrated activation CA occurs at a specific row, the control logic 190 may enter the second state S2. In the second state S2, the control logic 190 may determine one of the first policy P1 or the second policy P2.

When the first policy P1 is applied to the semiconductor memory device 100, under control of the control logic 190, the semiconductor memory device 100 may perform the refresh operation with respect to neighbor rows adjacent to an aggressor row, that is, victim rows. When the second policy P2 is applied to the semiconductor memory device 100, under control of the control logic 190, the semiconductor memory device 100 may flip data bits of memory cells in the aggressor row.

For example, the control logic 190 may set the flip signal FS to a second level. The control logic 190 may allow the counter 131 to generate column addresses increasing sequentially. The flip circuit 181 of the buffer circuit 180 may receive data bits of memory cells connected with the activated row of the selected bank in the selected bank group, based on the column addresses generated by the counter 131. The flip circuit 181 may flip the received data bits, and the flipped data bits may be written, for example, overwritten on the data bits of the memory cells connected with the activated row of the selected bank in the selected bank group.

Figure 5:
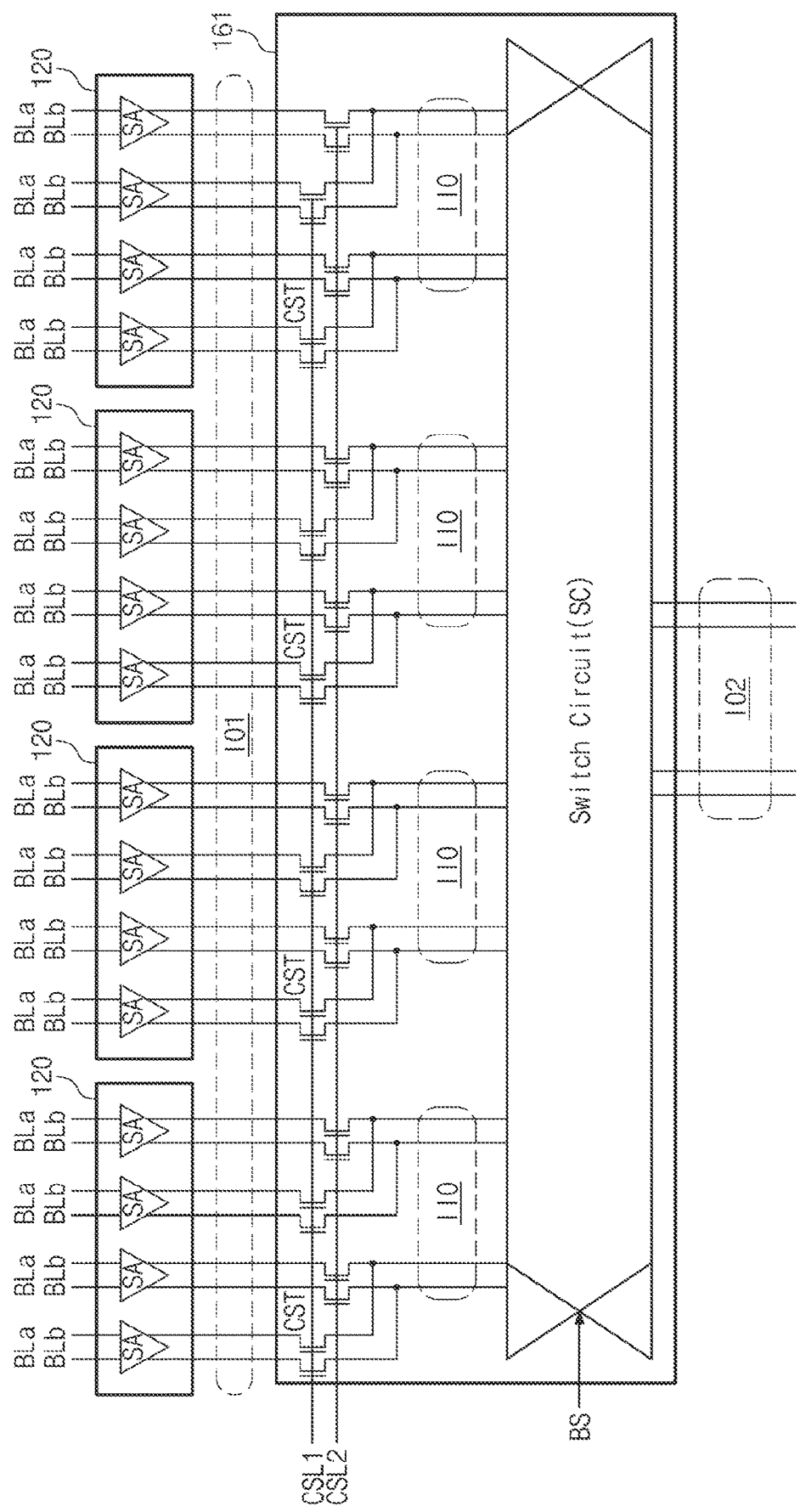
FIG. 5 illustrates an example of sense amplifiers and a local gating circuit corresponding to one bank group of a semiconductor memory device of FIG. 4.

FIG. 5 illustrates an example of the sense amplifiers 120 and the local gating circuit 161 corresponding to one bank group (e.g., BG1) of the semiconductor memory device 100 of FIG. 4. Referring to FIGS. 4 and 5, each of the sense amplifiers 120 may include a plurality of bit line sense amplifiers SA. Each of the plurality of bit line sense amplifiers SA may be connected with a corresponding bit line pair of bit line pairs BLa and BLb.

Voltages of a pair of bit lines may be controlled complementarily (e.g., during a given time period, one voltage level may be a high level, and the other voltage level may be a low level). As each of the plurality of bit line sense amplifiers SA amplifies a difference of voltages of a corresponding pair of bit lines, the plurality of bit line sense amplifiers SA may sense data bits stored in memory cells of an activated row.

Each bit line sense amplifier SA may amplify a difference of a pair of bit lines so as to be output to a corresponding pair of input and output lines of the first input and output lines IO1 (herein and below, used as a meaning of lines corresponding to the first bank group BG1 from among the first input and output lines IO1). Voltages of a pair of input and output lines may be controlled complementarily (e.g., during a given time period, one voltage level may be a high level, and the other voltage level may be a low level).

An example in which one bank includes 4 bit line sense amplifiers SA is illustrated in FIG. 5. However, the number of bit line sense amplifiers SA included in one bank is not limited.

The local gating circuit 161 may include column selection transistors CST, internal input and output lines IIO, and a switch circuit SC. The column selection transistors CST may be connected between the first input and output lines IO1 and the internal input and output lines IIO. The column selection transistors CST may select bank lines to be electrically connected with the internal input and output lines IIO, from among the first to fourth bank lines corresponding to the first to fourth banks B1 to B4 of the first bank group BG1.

For example, the column selection transistors CST connected with a first column selection line CSL1 may be activated (e.g., turned on) in response to that an active voltage is applied to the first column selection line CSL1. In this case, bank lines associated with the first column selection line CSL1 from among the first bank lines belonging to the first bank group lines of the first input and output lines IO1 may be electrically connected with the internal input and output lines IIO.

Likewise, in response to that the first column selection line CSL1 is activated, bank lines associated with the first column selection line CSL1 from among the second to fourth bank lines belonging to the first bank group lines may be electrically connected with the internal input and output lines IIO.

The column selection transistors CST connected with a second column selection line CSL2 may be activated (e.g., turned on) in response to that the active voltage is applied to the second column selection line CSL2. In this case, bank lines associated with the second column selection line CSL2 from among the first bank lines belonging to the first bank group lines of the first input and output lines IO1 may be electrically connected with the internal input and output lines IIO.

Likewise, in response to that the second column selection line CSL2 is activated, bank lines associated with the second column selection line CSL2 from among the second to fourth bank lines belonging to the first bank group lines may be electrically connected with the internal input and output lines IIO. That is, internal input and output line pairs, the number of which corresponds to the number of column selection lines CSL1 and CSL2, may be connected with the local gating circuit 161.

An example in which two column selection lines CSL1 and CSL2 are provided for each bank is illustrated in FIG. 4. However, the number of column selection lines provided for each bank is not limited. Also, an example in which the first column selection line CSL1 and the second column selection line CSL2 are provided in common to banks belonging to one bank group is illustrated in FIG. 4. However, column selection lines may be independently provided for each of banks belonging to the same bank group. In contrast, the first column selection line CSL1 and the second column selection line CSL2 may be provided in common to the banks B1, B2, B3, and B4 of the four bank groups BG1, BG2, BG3, and BG4.

The switch circuit SC may operate in response to a bank selection signal BS. In response to the bank selection signal BS, the switch circuit SC may select pairs of lines corresponding to one bank from among the pairs of internal input and output lines IIO. The switch circuit SC may electrically connect the selected pairs of lines with pairs of second input and output lines IO2 (herein and below, used as a meaning of lines corresponding to the first bank group BG1 from among the second input and output lines IO2).

Voltages of a pair of input and output lines of the pairs of second input and output lines IO2 may be controlled complementarily (e.g., during a given time period, one voltage level may be a high level, and the other voltage level may be a low level). Two pairs of second input and output lines IO2 are illustrated in FIG. 5 as an example, but the number of pairs of second input and output lines IO2 is not limited. The number of pairs of second input and output lines IO2 may correspond to the number of column selection lines CSL1 and CSL2.

In an embodiment, the switch circuit SC may function as a multiplexer electrically connecting the internal input and output lines IIO with the second input and output lines IO2 or a demultiplexer electrically connecting the second input and output lines IO2 with the internal input and output lines IIO.

In an embodiment, the switch circuit SC may operate as a sense amplifier. For example, the switch circuit SC may sense and amplify signals of lines corresponding to the selected bank from among the internal input and output lines IIO so as to be transferred to the second input and output lines IO2. The switch circuit SC may sense and amplify signals of the second input and output lines IO2 so as to be transferred to the lines corresponding to the selected bank from among the internal input and output lines IIO. The switch circuit SC may be also referred to as a "local sense amplifier".

In an embodiment, the first column selection line CSL1, the second column selection line CSL2, and the bank selection signal BS may be included in the second selection signals SEL2.

In the semiconductor memory device 100 of FIG. 4, the global gating circuit 170 may be implemented to be similar to the switch circuit SC. In response to the first selection signals SEL1, the global gating circuit 170 may electrically connect pairs of lines corresponding to one bank group from among the pairs of second input and output lines IO2 with pairs of third input and output lines IO3. The global gating circuit 170 may function as a multiplexer or a demultiplexer. Thus, additional description associated with the global gating circuit 170 will be omitted to avoid redundancy.

Voltages of a pair of input and output lines of the pairs of third input and output lines IO3 may be controlled complementarily (e.g., during a given time period, one voltage level may be a high level, and the other voltage level may be a low level). In an embodiment, the number of pairs of third input and output lines IO3 is not limited. The number of pairs of third input and output lines IO3 may correspond to the number of column selection lines CSL1 and CSL2 or the number of second pads PAD2 for transferring the data signals DQ.

Figure 6:
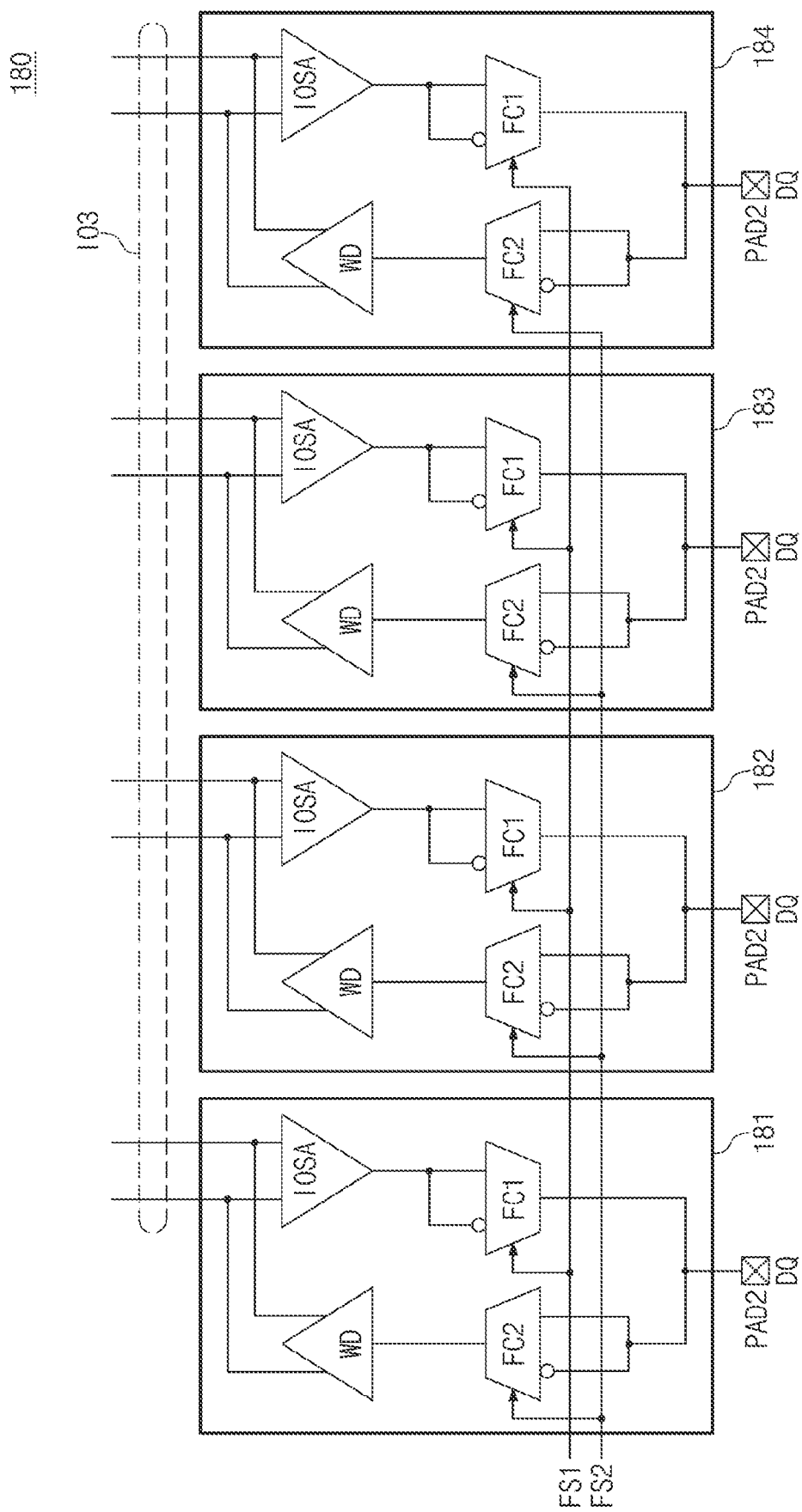
FIG. 6 illustrates an example of a buffer circuit of a semiconductor memory device of FIG. 4.

FIG. 6 illustrates an example of the buffer circuit 180 of the semiconductor memory device 100 of FIG. 4. Referring to FIGS. 4 and 6, the buffer circuit 180 may include first to fourth buffers 181, 182, 183, and 184. An example in which the buffer circuit 180 includes 4 buffers 181, 182, 183, and 184 is illustrated in FIG. 6, but the number of buffers included in the buffer circuit 180 is not limited. For example, the number of buffers 181, 182, 183, and 184 may correspond to the number of column selection lines CSL1 and CSL2 (refer to FIG. 5) or the number of second pads PAD2 for transferring the data signals DQ. In an embodiment, components of the buffer circuit 180, which are associated with the data strobe signal DQS, are omitted in FIG. 6.

Each of the first to fourth buffers 181, 182, 183, and 184 may include an input and output sense amplifier IOSA, a write driver WD, a first flip circuit FC1, and a second flip circuit FC2. The first flip circuit FC1 and the second flip circuit FC2 may be included in the flip circuit (FC) 181 of FIG. 4.

The input and output sense amplifier IOSA may be connected with a corresponding pair of lines of the pairs of third input and output lines IO3. The input and output sense amplifier IOSA may amplify a voltage difference of the corresponding pair of lines to generate an amplification result and may output a data bit having one of a first bit value and a second bit value based on the amplification result.

The first flip circuit FC1 may receive an output bit signal of the input and output sense amplifier IOSA and an inverted bit signal of the output bit signal. The first flip circuit FC1 may output the output bit signal of the input and output sense amplifier IOSA and the inverted bit signal in response to a first flip signal FS1. An output of the first flip circuit FC1 may be transferred to a corresponding pad of the second pads PAD2. The first flip signal FS1 may be included in the flip signal FS of FIG. 4.

The second flip circuit FC2 may receive a bit signal transferred through the corresponding pad of the second pads PAD2 and an inverted bit signal of the received bit signal. The second flip circuit FC2 may output the bit signal received through the corresponding pad of the second pads PAD2 and the inverted bit signal in response to a second flip signal FS2. An output of the second flip circuit FC2 may be transferred to the write driver WD. The second flip signal FS2 may be included in the flip signal FS of FIG. 4.

The write driver WD may receive the output of the second flip circuit FC2. The write driver WD may output signals (e.g., complementary signals) that correspond to the receive signal, for example, signals having a bit value of the received bit signal and an inverted bit value of the received bit signal. A pair of output lines of the write driver WD may be connected with a corresponding pair of lines of the pairs of third input and output lines IO3.

In a read operation, the input and output sense amplifier IOSA may receive signals (e.g., complementary bit signals) corresponding to a data bit stored in the corresponding bit line sense amplifier SA and may sense and amplify the received signals so as to be output as an output bit signal. The first flip circuit FC1 may output the output bit signal or the inverted bit signal to the corresponding pad of the second pads PAD2 in response to the first flip signal FS1. For example, in response to the first flip signal FS1, the first flip circuit FC1 may selectively invert the data bit stored in the bit line sense amplifier SA so as to be output to the corresponding pad of the second pads PAD2. For example, the first flip circuit FC1 may include an inverter to invert the data bit.

In a write operation, the second flip circuit FC2 may receive a bit signal transferred through the corresponding pad of the second pads PAD2 and an inverted bit signal of the received bit signal. The second flip circuit FC2 may output the output bit signal or the inverted bit signal to the write driver WD in response to the second flip signal FC2. For example, in response to the second flip signal FS2, the second flip circuit FC2 may selectively invert the received bit signal so as to be output to the write driver WD. For example, the second flip circuit FC2 may include an inverter to invert the bit signal.

In the flip operation, the first flip signal FS1 and the second flip signal FS2 may have different levels. That is, one of the first flip circuit FC1 and the second flip circuit FC2 may output a signal of a positive input, and the other thereof may output a signal of a negative input. That is, a data bit stored in the bit line sense amplifier SA may be inverted by one of the first flip circuit FC1 and the second flip circuit FC2. The write driver WD may write (e.g., overwrite) the inverted data bit in the bit line sense amplifier SA.

Figure 7:
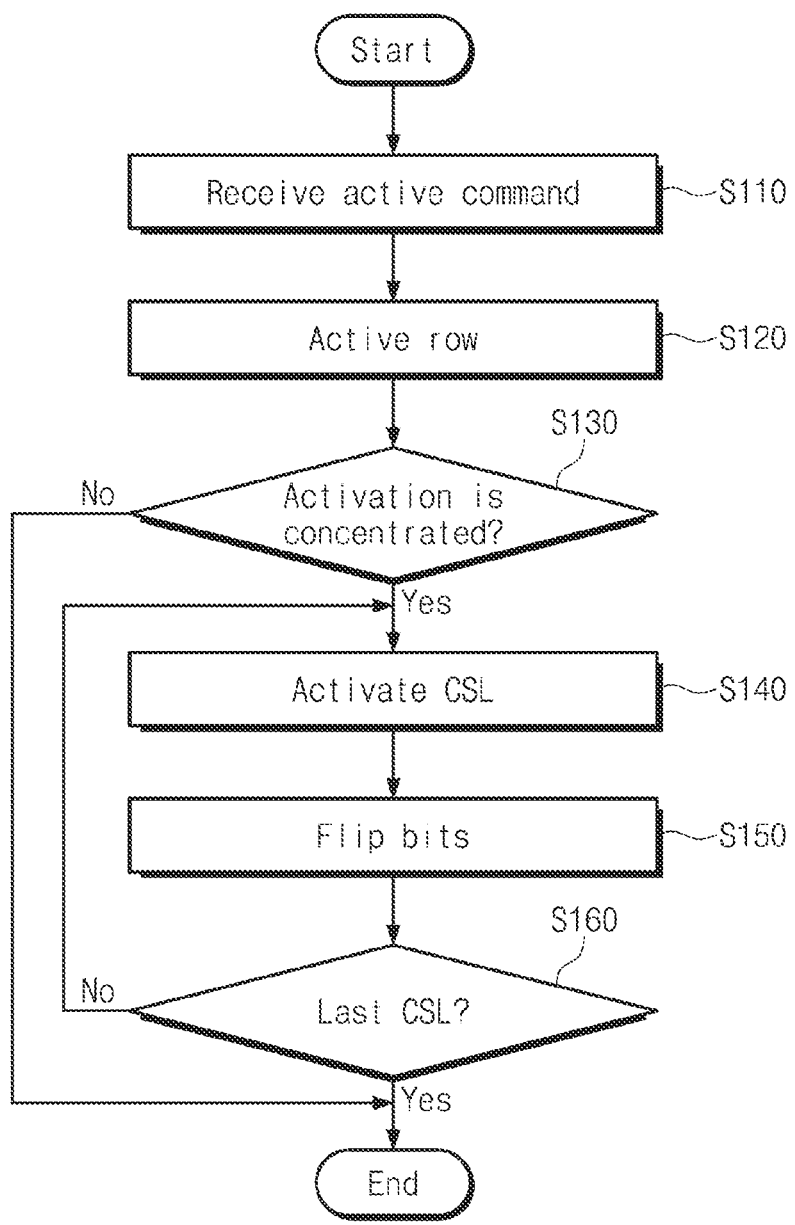
FIG. 7 illustrates an example of an operating method of a semiconductor memory device of FIG. 4 according to an embodiment of the present disclosure.

FIG. 7 illustrates an example of an operating method of the semiconductor memory device 100 of FIG. 4 according to an embodiment of the disclosure. In an embodiment, an example of a method for flipping data bits of an aggressor row based on the second policy P2 is illustrated in FIG. 7. Referring to FIGS. 2, 3, 4, 5, 6, and 7, in operation S110, the control logic 190 receives an active command as the command CMD. Also, the control logic 190 and the address register 130 may receive a bank group address, a bank address, and a row address as the address ADDR.

In response to the active command, in operation S120, the row decoder 140 selects a row of the memory cell array 110 such that a word line of the selected row is activated. The row decoder 140 may select a bank group based on the bank group address, may select one of banks of the selected bank group based on the bank address, and may select one of rows of the selected bank such that a word line of the selected row is activated. For example, the row decoder 140 may apply a voltage for turning on the selection element SE to the selected word line. The sense amplifier 120 of the selected bank in the selected bank group may sense and store (or latch) data bits stored in memory cells of the selected row.

The column decoder 150 may generate the first selection signals SEL1 based on the bank group address and may generate some (e.g., the bank selection signal BS) of the second selection signals SEL2 based on the bank address. Based on some of the first selection signals SEL1 and the second selection signals SEL2, pairs of internal input and output lines IIO corresponding to the selected bank of the selected bank group may be electrically connected with the pairs of third input and output lines IO3.

After the data bits of the memory cell of the selected rows are stored in the sense amplifier 120, access (e.g., write or read access) to the data bits stored in the sense amplifier 120 may be permitted. The activation of the selected row may be completed within a time defined by the standard of the semiconductor memory device 100.

In operation S130, the control logic 190 determines whether the activation associated with the selected row is concentrated. For example, the control logic 190 may determine whether the concentrated activation occurs at the selected row. When the concentrated activation does not occur at the selected row, the semiconductor memory device 100 may terminate the procedure without performing the process of compensating for or suppressing the stress or error due to the concentrated activation. Afterwards, the semiconductor memory device 100 may wait for the command CMD and the address ADDR of the memory controller 200. For example, the error may be a change to data stored in a row adjacent to the selected row where the concentrated activation occurs.

When the concentrated activation occurs at the selected row, the semiconductor memory device 100 performs the process of compensating for or suppressing the stress or error due to the concentrated activation. For example, the semiconductor memory device 100 may perform operation S140, operation S150, and operation S160.

In operation S140, the semiconductor memory device 100 activates a column selection line (e.g., CSL) under control of the control logic 190. For example, the counter 131 may generate a column address. The column decoder 150 may activate a column selection line corresponding to the column address generated by the counter 131 from among column selection lines.

In response to determining that the column selection line is activated, some of bit lines of the selected bank in the selected bank group, that is, some of columns of memory cells may be electrically connected with the buffer circuit 180.

In operation S150, data associated with the selected word line and the activated column selection line are flipped. The input and output sense amplifier IOSA of the buffer circuit 180 may determine a data bit stored in the corresponding bit line sense amplifier SA. The control logic 190 may flip the data bit by using one of the first flip circuit FC1 and the second flip circuit FC2 of the buffer circuit 180. The write driver WD may write (e.g., overwrite) the flipped data bit in the corresponding bit line sense amplifier SA.

In operation S160, the control logic 190 determines whether the activated column selection line is the last column selection line. For example, the control logic 190 may determine whether all the column selection lines of the activated row are selected, that is, whether data bits of all memory cells are flipped. When the activated column selection line is not the last column selection line, the counter 131 may count up (or increment) the current column address to generate a next column address. In operation S140 to operation S160, the semiconductor memory device 100 may flip (or invert) data bits of memory cells associated with the next column selection line.

When the activated column selection line is the last column selection line, the control logic 190 may store a row address of a row where the flip operation is performed, that is, the activated row. When the flip operation is once performed with respect to a specific row, the control logic 190 may store a row address of the specific row. When the flip operation is again once performed with respect to the specific row, the control logic 190 may clear or delete the row address. Depending on whether a row address is stored, the control logic 190 may selectively activate the first flip signal FS1 and/or the second flip signal FS2 in the write operation or the read operation.

As another example, when the activated column selection line is the last column selection line, the control logic 190 may store a flag bit (e.g., flip or inversion information) in storage (e.g., a memory cell or a register) having a correlation with the activated row. When the flip operation is once performed with respect to a specific row, the control logic 190 may store the flag bit of a first value. When the flip operation is again once performed with respect to the specific row, the control logic 190 may store the flag bit of a second value. The first value is different from the second value. Depending on whether the flag bit indicates one of the first value and the second value, the control logic 190 may selectively activate the first flip signal FS1 and/or the second flip signal FS2 in the write operation or the read operation.

In an embodiment, the control logic 190 may store the flag bit in an internal register or storage. For example, a flag bit for each of the rows that is either set to the first value or cleared to the second value may be stored in the internal register. As another example, the control logic 190 may store the flag bit in some of the memory cells of the memory cell array 110. For example, the control logic 190 may store the flag bit of a corresponding row in at least one of memory cells belonging to each row.

As another example, the row decoder 140 may include storage elements, which respectively correspond to the word lines WL, such as registers or latches. The row decoder 140 may store the flag bit in a storage element corresponding to each row.

After processing information indicating that the flip operation is performed, the semiconductor memory device 100 may terminate the process of compensating for or suppressing the stress or error due to the concentrated activation.

In an embodiment, operation S140 to operation S160 may be performed immediately after a selected row is activated. As another example, operation S140 to operation S160 may be performed when a selected row is deactivated. For example, in response to determining that a command (e.g., a precharge command) for deactivating the activated row is received from the memory controller 200, the semiconductor memory device 100 may perform operation S140 to operation S160 and may deactivate the activated row.

Figure 8:
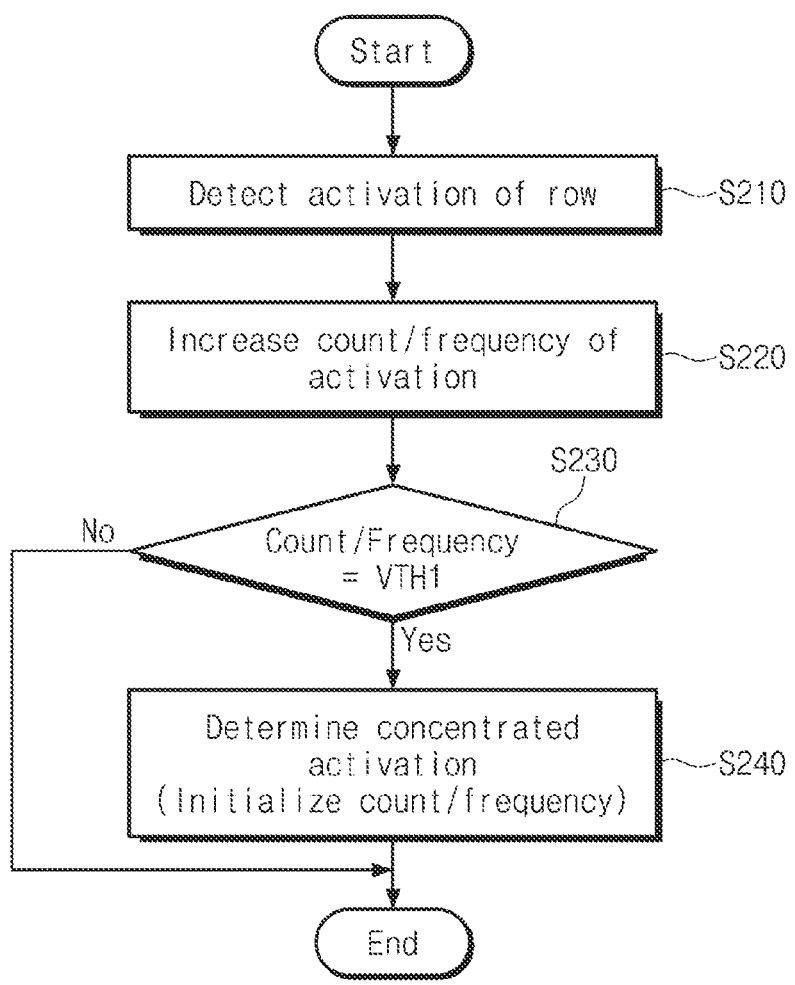
FIG. 8 illustrates an example of a process in which control logic determines whether concentrated activation occurs at an activated row.

FIG. 8 illustrates an example of a process in which the control logic 190 determines whether the concentrated activation occurs at an activated row. Referring to FIGS. 2, 4, and 8, in operation S210, the control logic 190 detects activation of a specific row. For example, in response to determining that the active command is received as the command CMD and a bank group address, a bank address, and a row address are received as the address ADDR, the control logic 190 may detect activation of a row corresponding to the bank group address, the bank address, and the row address.

In operation S220, the control logic 190 increases a count and/or a frequency of the activation. For example, when the number of rows adjacent to an activated row is "1", the control logic 190 may manage one count and/or one frequency, with regard to the activated row. When the number of rows adjacent to an activated row is "2", the control logic 190 may manage two counts and/or two frequencies corresponding to two neighbor rows, with regard to the activated row. A counter for calculating a count and/or a frequency may be included in the control logic 190.

For example, the count may indicate the number of times that a currently selected row is activated and then deactivated after the refresh operation is performed with respect to a neighbor row or the neighbor row is activated and then deactivated. For example, the count may indicate the number of times that the active command is received as the command CMD and an address of a currently activated row is received as the address ADDR, after the refresh operation is performed with respect to a neighbor row or the neighbor row is activated and then deactivated.

The frequency may indicate the number of times that a currently selected row is activated and then deactivated during a given time window after the refresh operation is performed with respect to a neighbor row or the neighbor row is activated and then deactivated. For example, the frequency may correspond to the count that increases during the given time window. The given time window may correspond to a period from a past point in time preceding a point in time (e.g., a current point in time), at which a currently selected row is activated, as much as a given time period, to a current point in time.

In operation S230, the control logic 190 determines whether the count and/or the frequency reaches a first threshold value VTH1. When the count and/or the frequency does not reach the first threshold value VTH1, the control logic 190 determines that the concentrated activation does not occur at the activated row. Afterwards, the control logic 190 may terminate the algorithm for determining the concentrated activation in association with the flip operation.

When it is determined in operation S230 that the count and/or the frequency reaches the first threshold value VTH1, in operation S240, the control logic 190 determines that the concentrated activation occurs at the activated row. After determining that the concentrated activation occurs at the activated row, the control logic 190 may initialize the count and/or the frequency.

In an embodiment, in response to determining that the refresh operation or activation is performed with respect to a specific row, the control logic 190 may initialize a count and/or a frequency of a neighbor row adjacent to the specific row.

As described above, in the fourth state S4 according to the first policy P2 of FIG. 3, the control logic 190 may determine the occurrence of concentrated activation by comparing a count and/or a frequency of the activation associated with the activated row with the first threshold value VTH1 and may selectively flip data bits of memory cells in an aggressor row based on a determination result.

As in the above description, in the third state S3 according to the second policy P1 of FIG. 3, the control logic 190 may determine the occurrence of concentrated activation by comparing a count and/or a frequency of the activated row with a threshold value equal to or different from the first threshold value VTH1 and may selectively perform the refresh operation with respect to data bits of memory cells in a victim row based on a determination result. For example, the refresh operation may include reading the data bits from the victim row and writing the read bits to the victim row.

Figure 9:
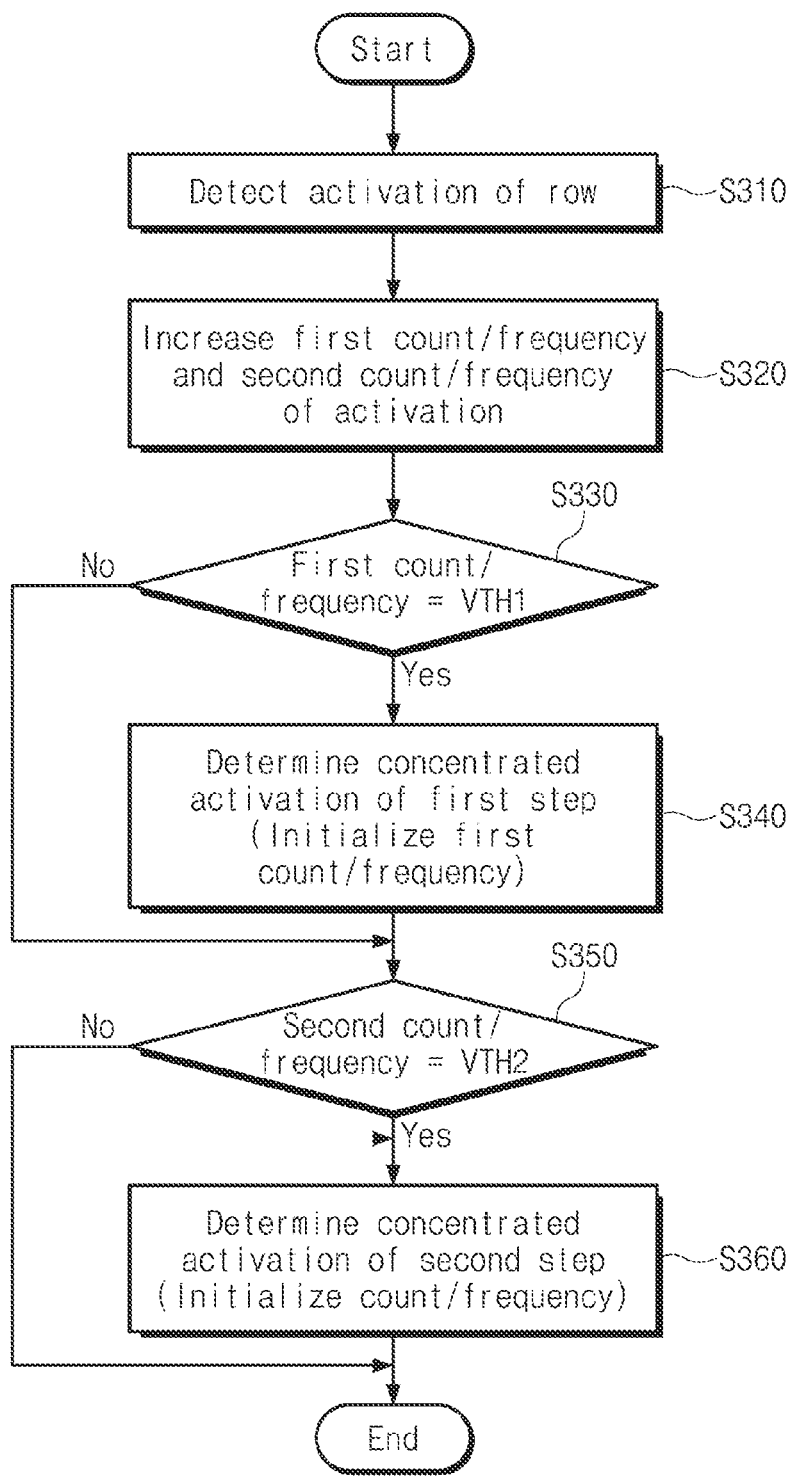
FIG. 9 illustrates an example of a process in which a semiconductor memory device determines concentrated activation in association with a flip operation and a refresh operation.

FIG. 9 illustrates an example of a process in which the semiconductor memory device 100 determines the concentrated activation in association with the flip operation and the refresh operation. Referring to FIGS. 1, 2, 3, 4, and 9, the control logic 190 of the semiconductor memory device 100 may perform the flip operation for an aggressor row and the refresh operation for a victim row together depending on the first policy P1 and the second policy P2.

In operation S310, the control logic 190 detects activation of a row. Operation S310 may be performed to be identical to operation S210.

In operation S320, the control logic 190 increases a first count and/or a first frequency and a second count and/or a second frequency of the activation. The first count and/or the first frequency may be used in association with the flip operation. The second count and/or the second frequency may be used in association with the refresh operation. Operation S320 may be performed similarly to operation S220. A counter for calculating the first count and/or the first frequency and the second count and/or the second frequency may be included in the control logic 190.

In operation S330, the control logic 190 compares the first count and/or the first frequency with the first threshold value VTH1. When the first count and/or the first frequency does not reach the first threshold value VTH1, the control logic 190 may omit operation S340 and may perform operation S350. When the first count and/or the first frequency reaches the first threshold value VTH1, the control logic 190 performs operation S340. Operation S330 may be performed similarly to operation S230.

In operation S340, the control logic 190 determines whether the concentrated activation of a first step occurs at an activated row. When the concentrated activation of the first step is determined, the semiconductor memory device 100 may perform the flip operation. After the concentrated activation of the first step is determined, the control logic 190 may initialize the first count and/or the first frequency. Operation S340 may be performed similarly to operation S240.

In operation S350, the control logic 190 compares the second count and/or the second frequency with a second threshold value VTH2. The second threshold value VTH2 may be greater than the first threshold value VTH1. When the second count and/or the second frequency does not reach the second threshold value VTH2, the control logic 190 may omit operation S360 and may terminate the algorithm for determining the concentrated activation. When the second count and/or the second frequency reaches the second threshold value VTH2, the control logic 190 performs operation S360.

In operation S360, the control logic 190 determines whether the concentrated activation of a second step occurs at the activated row. When the concentrated activation of the second step is determined, the semiconductor memory device 100 may perform the refresh operation. After the concentrated activation of the second step is determined, the control logic 190 may initialize the first count and/or the first frequency and the second count and/or the second frequency.

In an embodiment, the second threshold value VTH2 is greater than the first threshold value VTH1. The semiconductor memory device 100 may determine the concentrated activation of the first step in response to that the number of times or the frequency of activation reaches the first threshold value VTH1. The semiconductor memory device 100 may compensate for or suppress the accumulation of stress or error by performing the flip operation in response to determining that the concentrated activation of the first step occurs.

The semiconductor memory device 100 may determine the concentrated activation of the second step in response to that the number of times or the frequency of activation reaches the second threshold value VTH2. The semiconductor memory device 100 may overall remove the influence of stress or error by performing the refresh operation in response to determining that the concentrated activation of the second step occurs.

The stress or error that occurs between the refresh operations may be compensated for or suppressed by the flip operations. Accordingly, compared to the case where the refresh operation of a victim row is performed based on the first policy P1 of FIG. 3, in the case where both the refresh operation and the flip operation are performed based on the first policy P1 and the second policy P2 of FIG. 3, a reference (e.g., the second threshold value VTH2) for determining the concentrated activation associated with the refresh operation may be set to a greater value.

In an embodiment, when a specific row is continuously activated, the flip operation and the refresh operation may be alternately performed in association with the specific row. When the first count and/or the first frequency reaches the first threshold value VTH1 and the second count and/or the second frequency also reaches the second threshold value VTH2, the flip operation and the refresh operation may be performed (or reserved) in association with the specific row. As another example, when the first count and/or the first frequency reaches the first threshold value VTH1 and the second count and/or the second frequency also reaches the second threshold value VTH2, the flip operation may be omitted, and only the refresh operation may be performed.

Figure 10:
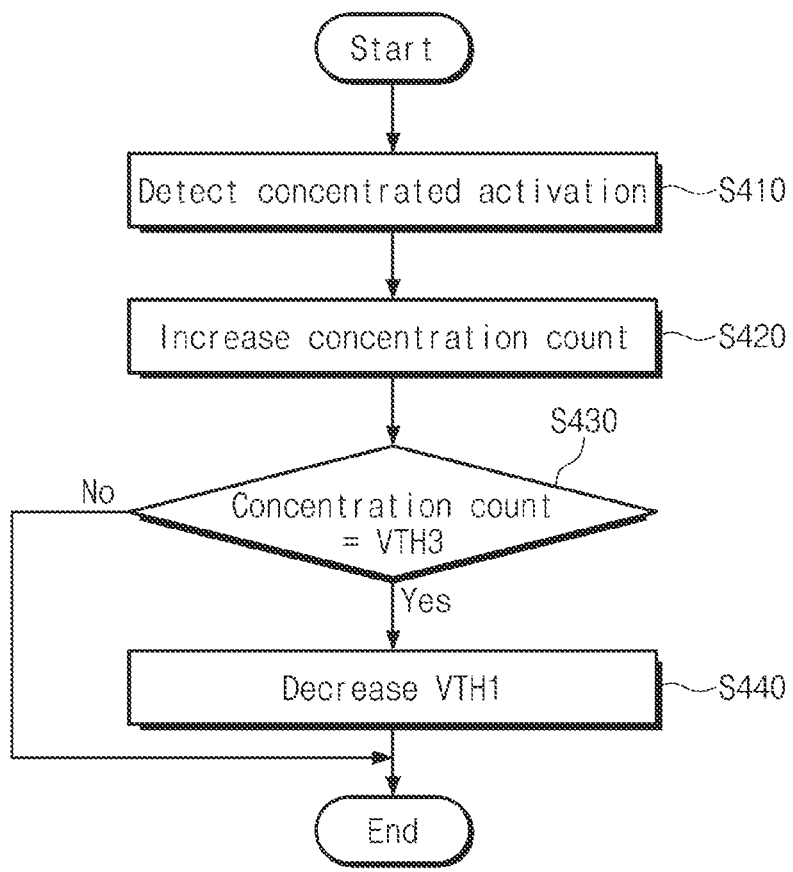
FIG. 10 illustrates an example of a process in which a semiconductor memory device adjusts a reference value for determining concentrated activation according to an embodiment of the present disclosure.

FIG. 10 illustrates an example of a process in which the semiconductor memory device 100 adjusts a reference value (e.g., the first threshold value VTH1) for determining concentrated activation. Referring to FIGS. 1, 2, 4, 8, and 10, in operation S410, the control logic 190 detects the concentrated activation based on the first threshold value VTH1 as described with reference to FIG. 8.

In operation S420, the control logic 190 increases a concentration count in response to detecting the concentrated activation. In operation S430, the control logic 190 determines whether the concentration count reaches a third threshold value VTH3. When the concentration count does not reach the third threshold value VTH3, the control logic 190 may not perform (or may omit) operation S440 and may terminate the algorithm for adjusting a reference value.

When the concentration count reaches the third threshold value VTH3, in operation S440, the control logic 190 decreases the first threshold value VTH1. That is, in response to that the concentrated activation continuously occurs at a specific row (as much as the third threshold value VTH3), the semiconductor memory device 100 may decrease the first threshold value VTH1 that is used as a determination reference for determining the concentrated activation (or performing the flip operation). The control logic 190 may initialize the concentration count in response to that the concentrated activation continuously occurs at the specific row (as much as the third threshold value VTH3).

In an embodiment, the control logic 190 may stepwise decrease the first threshold value VTH1. That is, when the concentration count reaches the third threshold value VTH3, the control logic 190 may decrease the first threshold value VTH1. When the concentration count again reaches the third threshold value VTH3, the control logic 190 may further decrease the first threshold value VTH1.

In an embodiment, in the case where the number of neighbor rows adjacent to the specific row is 2, the control logic 190 may manage two concentration counts with regard to the specific row. When the refresh operation or activation is performed with respect to the specific row, the control logic 190 may initialize the first threshold value VTH1 and the concentration count of a neighbor row adjacent to the specific row.

Figure 11:
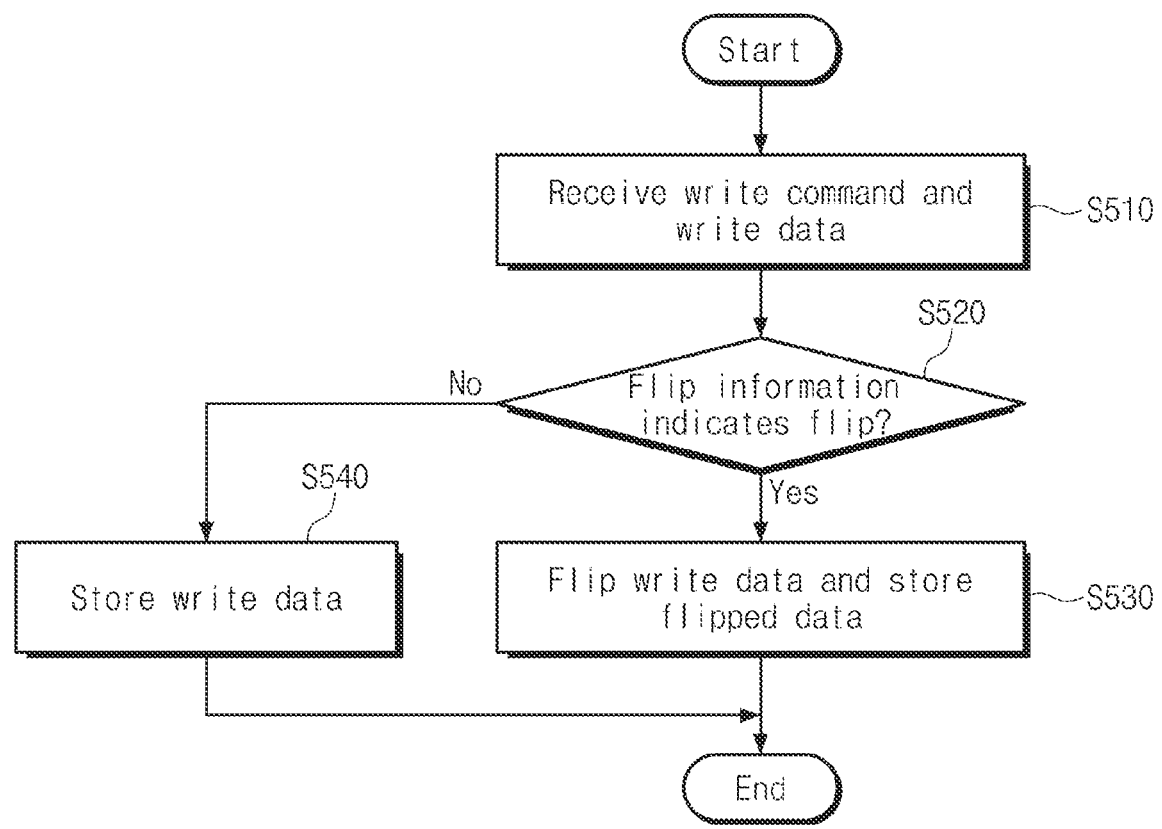
FIG. 11 illustrates an example of a process in which a semiconductor memory device performs a write operation when performing a flip operation with respect to an aggressor row based on a second policy of FIG. 3.

FIG. 11 illustrates an example of a process in which the semiconductor memory device 100 performs the write operation when performing the flip operation with respect to an aggressor row based on the second policy P2 of FIG. 3. Referring to FIGS. 1, 2, 3, 4, 6, and 11, in operation S510, the semiconductor memory device 100 receives a write command as the command CMD and receives write data as the data signals DQ.

In an embodiment, the write command and the write data may be received after a specific row is activated. The write command and the write data may be received together with a column address as the address ADDR.

In operation S520, the control logic 190 determines whether flip information of the activated row indicates a flip. When the flip information of the activated row indicates a flip, data bits stored in the sense amplifier 120 may be in a flip state. In operation S530, the control logic 190 flips (or inverts) the write data and stores the flipped write data. The control logic 190 may control the second flip signal FS2 such that the second flip circuits FC2 of the buffer circuit 180 output inverted bit signals. That is, the semiconductor memory device 100 may flip the write data and may store (e.g., overwrite) the flipped data on data bits corresponding to the column address from among the data bits of the sense amplifier 120.

When the flip information of the activated row does not indicate a flip, the data bits stored in the sense amplifier 120 may be in a normal state, not the flip state. In operation S540, the control logic 190 stores the write data without performing the flip. The control logic 190 may control the second flip signal FS2 such that the second flip circuits FC2 of the buffer circuit 180 output bit signals. That is, the semiconductor memory device 100 may store (e.g., overwrite) the write data on the data bits corresponding to the column address from among the data bits of the sense amplifier 120 (without the flip operation).

The data stored in the sense amplifier 120 may be written in memory cells when the activated row is deactivated. That is, the semiconductor memory device 100 may selectively invert write data based on flip information and may write (e.g., overwrite) the write data (or the inverted write data) in memory cells.

Figure 12:
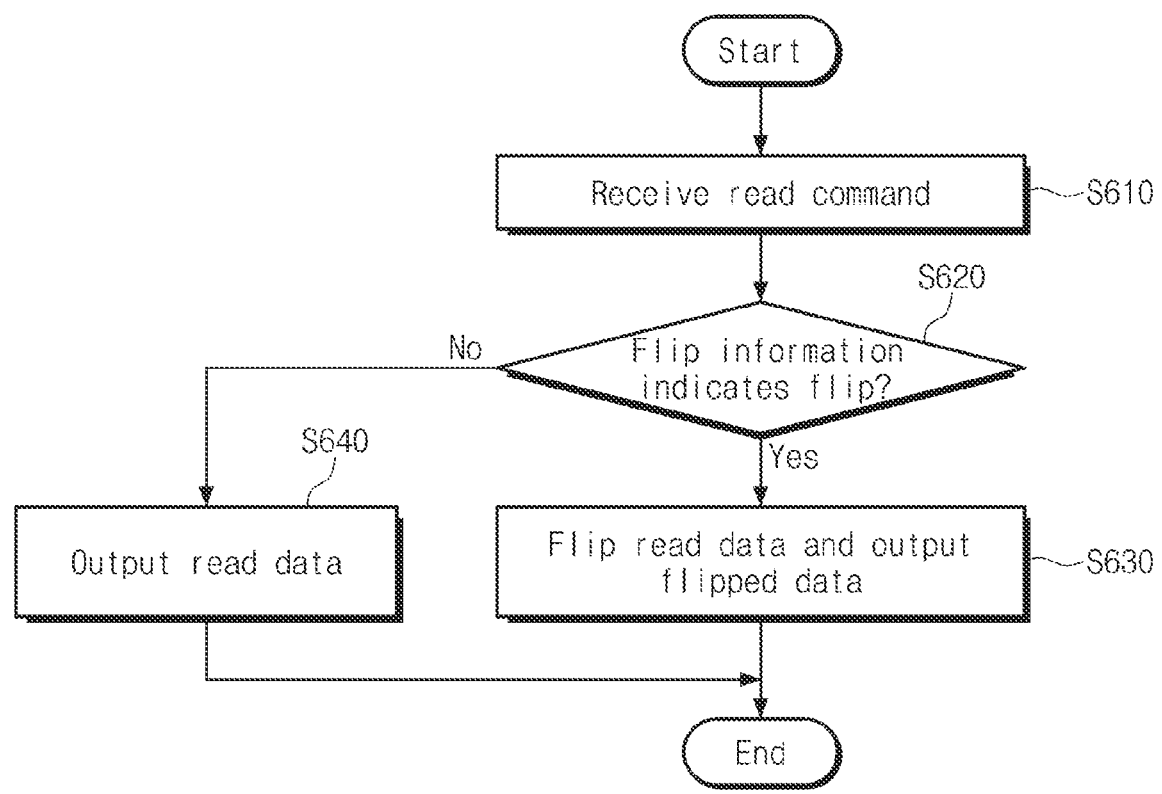
FIG. 12 illustrates an example of a process in which a semiconductor memory device performs a write operation when performing a flip operation with respect to an aggressor row based on a second policy of FIG. 3.

FIG. 12 illustrates an example of a process in which the semiconductor memory device 100 performs a read operation when performing the flip operation with respect to an aggressor row based on the second policy P2 of FIG. 3. Referring to FIGS. 1, 2, 3, 4, 6, and 12, in operation S610, the semiconductor memory device 100 receives a read command as the command CMD. In an embodiment, the read command may be received after a specific row is activated. The read command may be received together with a column address as the address ADDR.

In operation S620, the control logic 190 determines whether flip information of the activated row indicates a flip. When the flip information of the activated row indicates a flip, data bits stored in the sense amplifier 120 may be in a flip state. In operation S630, the read data bits are flipped (or inverted) and output. The control logic 190 may control the first flip signal FS1 such that the first flip circuits FC1 of the buffer circuit 180 output inverted bit signals. That is, the semiconductor memory device 100 may flip data bits corresponding to the column address from among the data bits stored in the sense amplifier 120 and may output the flipped data bits as the data signals DQ.

When the flip information of the activated row does not indicate a flip, the data bits stored in the sense amplifier 120 may be in a normal state, not the flip state. In operation S640, the read data bits are output without being flipped or inverted. The control logic 190 may control the first flip signal FS1 such that the first flip circuits FC1 of the buffer circuit 180 output bit signals. That is, the semiconductor memory device 100 may output the data bits corresponding to the column address from among the data bits stored in the sense amplifier 120 as the data signals DQ.

That is, the semiconductor memory device 100 may selectively invert read data based on flip information so as to be output as the data signals DQ.

Figure 13:
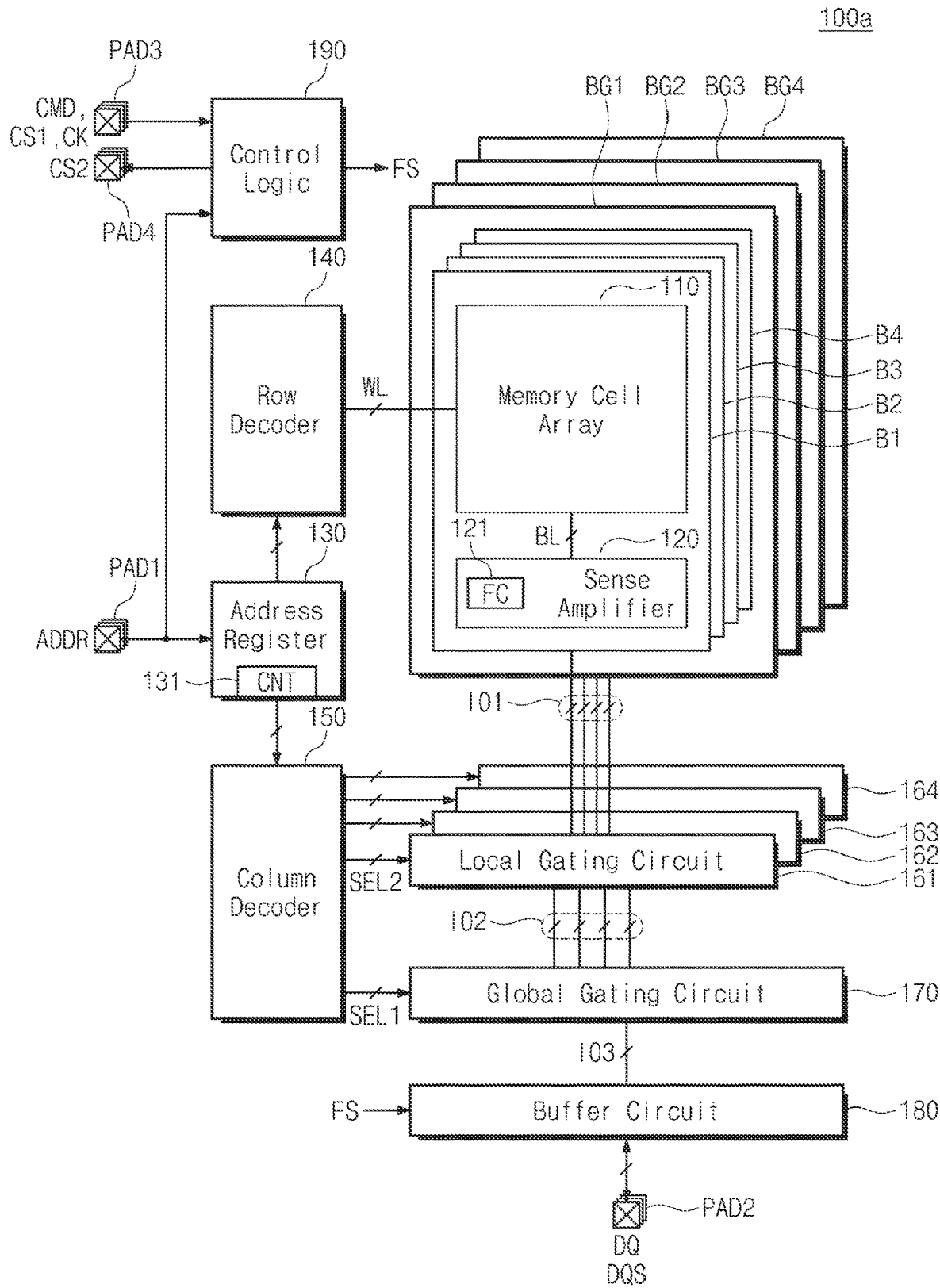
FIG. 13 illustrates a semiconductor memory device according to an embodiment of the present disclosure.

FIG. 13 illustrates a semiconductor memory device 100*a* according to an embodiment of the present disclosure Referring to FIGS. 1, 2, 3, 5, and 13, the semiconductor memory device 100*a* may include the first to fourth bank groups BG1 to BG4. Each of the first to fourth bank groups BG1 to BG4 may include the first to fourth banks B1 to B4. Each of the first to fourth banks B1 to B4 may include the memory cell array 110 and the sense amplifier 120.

The semiconductor memory device 100 may further include the address register 130, the row decoder 140, the column decoder 150, the first to fourth local gating circuits 161, 162, 163, and 164, the global gating circuit 170, the buffer circuit 180, and the control logic 190.

A configuration and an operation of the semiconductor memory device 100*a* may be identical to those of the semiconductor memory device 100 of FIG. 4 except that a flip circuit (FC) 121 is provided in the sense amplifier 120. Thus, additional description will be omitted to avoid redundancy. In each of the first to fourth banks B1 to B4 of the first to fourth bank groups BG1 to BG4, the sense amplifier 120 may include the flip circuit 121.

Figure 14:
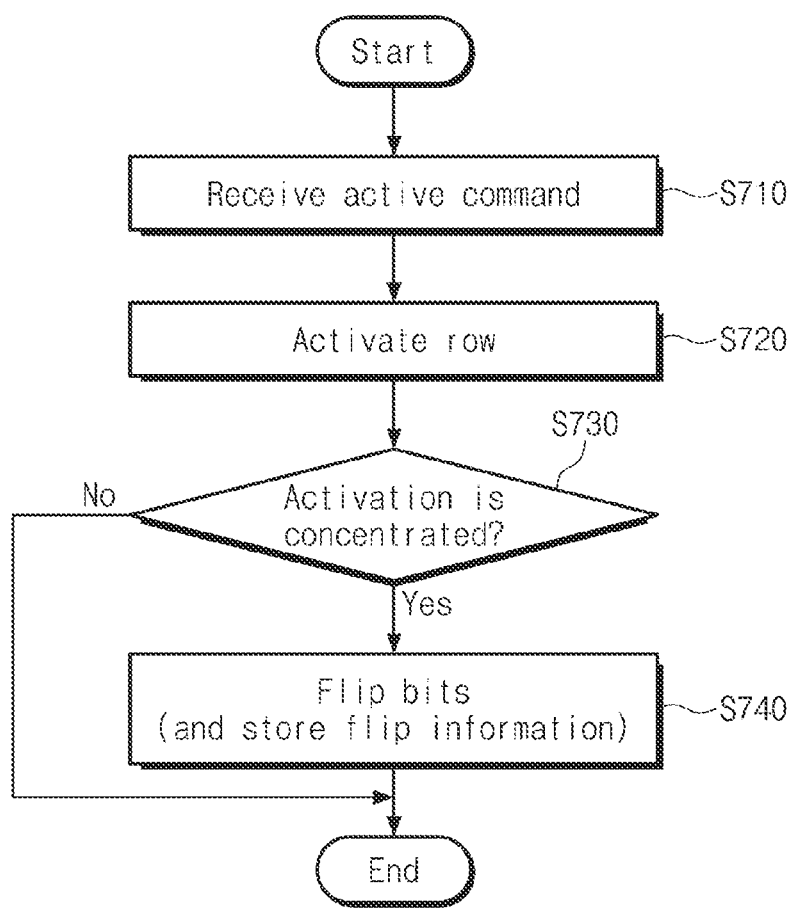
FIG. 14 illustrates an example of an operating method of a semiconductor memory device of FIG. 13 according to an embodiment of the present disclosure.

FIG. 14 illustrates an example of an operating method of the semiconductor memory device 100*a* of FIG. 13. In an embodiment, an example of a method for flipping data bits of an aggressor row based on the second policy P2 is illustrated in FIG. 14. Referring to FIGS. 2, 3, 5, 6, 13, and 14, in operation S710, the control logic 190 receives an active command as the command CMD. Also, the control logic 190 and the address register 130 may receive a bank group address, a bank address, and a row address as the address ADDR.

In response to the active command, in operation S720, the row decoder 140 selects one of the rows of the memory array cell 110 such that a word line of the selected row is activated. The row decoder 140 may select a bank group based on the bank group address, may select one of banks of the selected bank group based on the bank address, and may select one of rows of the selected bank such that a word line of the selected row is activated.

In operation S730, the control logic 190 determines whether the activation associated with the selected row is concentrated. For example, the control logic 190 may determine whether the concentrated activation occurs at the selected row. When the concentrated activation does not occur at the selected row, the semiconductor memory device 100 may terminate the procedure without performing the process of compensating for or suppressing the stress or error due to the concentrated activation. Afterwards, the semiconductor memory device 100 may wait for the command CMD and the address ADDR of the memory controller 200.

When the concentrated activation occurs at the selected row, the semiconductor memory device 100 may perform the process of compensating for or suppressing the stress or error due to the concentrated activation. For example, the semiconductor memory device 100 may perform operation S740. Operation S710, operation S720, and operation S730 may be identical to operation S110, operation S120, and operation S130.

When the concentrated activation occurs at the selected row, in operation S740, the control logic 190 may flip data bits. The control logic 190 may flip data bits by using one of the first flip circuit FC1 and the second flip circuit FC2 of the sense amplifier 120. The control logic 190 may store flip information of the activated row.

Comparing the semiconductor memory device 100 of FIG. 4 and the semiconductor memory device 100*a* of FIG. 13, the semiconductor memory device 100*a* of FIG. 13 may include the first flip circuit FC1 and the second flip circuit FC2 for each of pairs of bit line sense amplifiers or pairs of column selection transistors CST. Accordingly, all data bits stored in the sense amplifier 120 may be flipped at the same time.

In an embodiment, the semiconductor memory device 100 may be modified such that the first flip circuit FC1 and the second flip circuit FC2 are provided for each of pairs of internal input and output lines IIO or for each of pairs of second input and output lines IO2.

Figure 15:
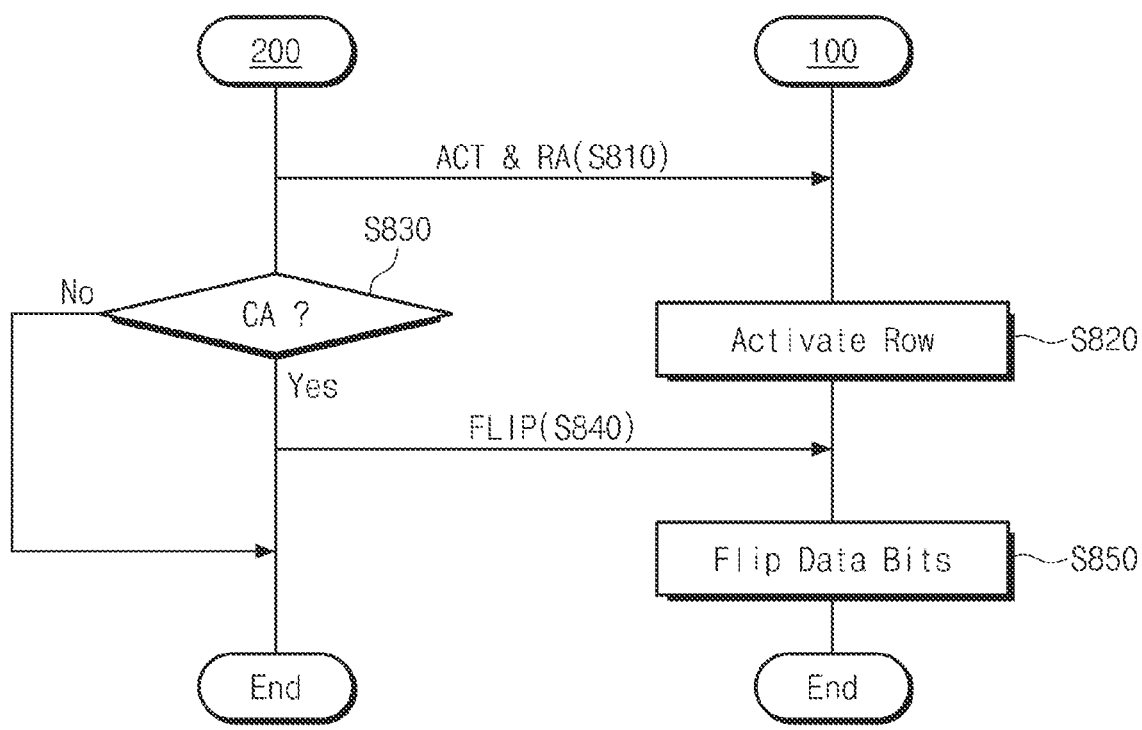
FIG. 15 illustrates an example of an operating method of a memory system according to an embodiment of the present disclosure.

FIG. 15 illustrates an example of an operating method of the memory system 10. Referring to FIGS. 1 and 15, in operation S810, the memory controller 200 transmits an active command ACT and a row address RA to the semiconductor memory device 100. In operation S820, the semiconductor memory device 100 activates a row corresponding to the row address RA.

In operation S830, the memory controller 200 determines whether the concentrated activation CA occurs. For example, the memory controller 200 may determine whether the concentrated activation CA occurs, based on the method described with reference to FIGS. 8 and 9. When the concentrated activation CA does not occur, the memory controller 200 may terminate the process of compensating for or suppressing the stress or error due to the concentrated activation CA.

When the concentrated activation CA occurs, in operation S840, the memory controller 200 transmits a flip command FLIP to the semiconductor memory device 100. In operation S850, in response to the flip command FLIP, the semiconductor memory device 100 flips data bits of the activated row.

Compared to the method of FIG. 7 or 14, the determination of the concentrated activation CA may be performed by the memory controller 200. Flip information may be managed by the semiconductor memory device 100. As described with reference to FIGS. 11 and 12, the semiconductor memory device 100 may selectively invert data bits based on the flip information and may perform the write operation or the read operation.

As another example, the flip information may also be managed by the memory controller 200. The semiconductor memory device 100 may perform the flip operation in response to the flip command FLIP and may not flip data bits in the write operation or the read operation. The memory controller 200 may flip write data based on the flip information so as to be transmitted to the semiconductor memory device 100 or may flip data transferred from the semiconductor memory device 100 based on the flip information.

Figure 16:
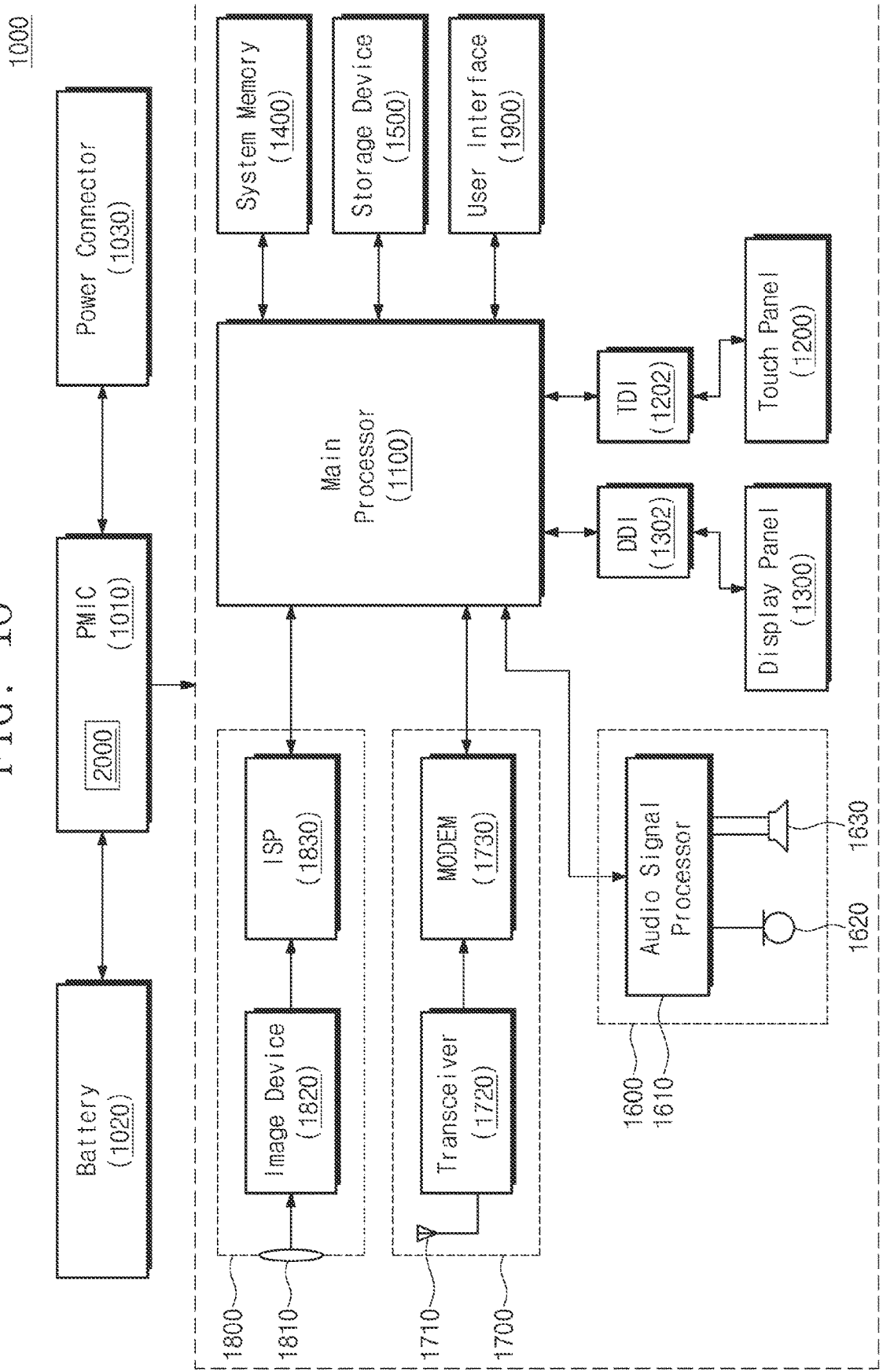
FIG. 16 illustrates an example of an electronic device according to an embodiment of the present disclosure.

FIG. 16 illustrates an example of an electronic device 1000 according to an embodiment of the present disclosure. Referring to FIG. 16, the electronic device 1000 may include a main processor 1100, a touch panel 1200, a touch driver integrated circuit (TDI) 1202, a display panel 1300, a display driver integrated circuit (DDI) 1302, a system memory 1400, a storage device 1500, an audio processor 1600, a communication block 1700, an image processor 1800, and a user interface 1900. In an embodiment, the electronic device 1000 may be one of various electronic devices such as a personal computer, a laptop computer, a server, a workstation, a portable communication terminal, a personal digital assistant (PDA), a portable media player (PMP), a digital camera, a smartphone, a tablet computer, and a wearable device.

The main processor 1100 may control overall operations of the electronic device 1000. The main processor 1100 may control/manage operations of the components of the electronic device 1000. The main processor 1100 may perform various operations for the purpose of operating the electronic device 1000. The touch panel 1200 may be configured to sense a touch input from a user under control of the touch driver integrated circuit 1202. The display panel 1300 may be configured to display image information under control of the display driver integrated circuit 1302.

The system memory 1400 may store data that are used in an operation of the electronic device 1000. For example, the system memory 1400 may include a volatile memory such as a static random access memory (SRAM), a dynamic RAM (DRAM), or a synchronous DRAM (SDRAM), and/or a nonvolatile memory such as a phase change RAM (PRAM), a magneto-resistive RAM (MRAM), a resistive RAM (ReRAM), or a ferroelectric RAM (FRAM).

The storage device 1500 may store data regardless of whether a power is supplied. For example, the storage device 1500 may include at least one of various nonvolatile memories such as a flash memory, a PRAM, an MRAM, a ReRAM, and a FRAM. For example, the storage device 1500 may include an embedded memory and/or a removable memory of the electronic device 1000.

The audio processor 1600 may process an audio signal by using an audio signal processor 1610. The audio processor 1600 may receive an audio input through a microphone 1620 or may provide an audio output through a speaker 1630. The communication block 1700 may exchange signals with an external device/system through an antenna 1710. A transceiver 1720 and a modulator/demodulator (MODEM) 1730 of the communication block 1700 may process signals exchanged with the external device/system in compliance with at least one of various wireless communication protocols: long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The image processor 1800 may receive a light through a lens 1810. An image device 1820 and an image signal processor (ISP) 1830 included in the image processor 1800 may generate image information about an external object, based on a received light. The user interface 1900 may include an interface capable of exchange information with a user, except for the touch panel 1200, the display panel 1300, the audio processor 1600, and the image processor 1800. The user interface 1900 may include a keyboard, a mouse, a printer, a projector, various sensors, a human body communication device, etc.

The electronic device 1000 may further include a power management IC (PMIC) 1010, a battery 1020, and a power connector 1030. The power management IC 1010 may generate an internal power from a power supplied from the battery 1020 or a power supplied from the power connector 1030, and may provide the internal power to the main processor 1100, the touch panel 1200, the touch driver integrated circuit (TDI) 1202, the display panel 1300, the display driver integrated circuit (DDI) 1302, the system memory 1400, the storage device 1500, the audio processor 1600, the communication block 1700, the image processor 1800, and the user interface 1900.

The electronic device 1000 may include the semiconductor memory device 100 or the memory system 10 described with reference to FIGS. 1 to 15. For example, the semiconductor memory device 100 or the memory system 10 of the present disclosure may be implemented with the system memory 1400. As another example, the semiconductor memory device 100 or the memory system 10 may be implemented with a memory of the touch driver integrated circuit 1202, the display driver integrated circuit 1302, the storage device 1500, the audio signal processor 1610, the MODEM 1730, the image signal processor 1830, and/or the user interface 1900.

In the above embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. need not involve an order or a numerical meaning of any form.

In the above embodiments, components according to embodiments of the present disclosure are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

According to the present disclosure, in response to that memory cells of a specific row are intensively activated, data bits stored in the memory cells of the specific row may be flipped. Accordingly, a method and a semiconductor memory device capable of compensating for or suppressing a stress coming from concentrated activation of memory cells in the specific row, and an operating method of a memory controller including the same are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A method for accessing memory cells arranged in rows and columns, the method comprising:
   activating a specific row of the rows of the memory cells; and
   in response to determining that a concentrated activation occurs at the specific row,
      reading first data stored in memory cells of the specific row;
      flipping first data bits of the first data to generate second data;
      writing the second data to the memory cells of the specific row; and
      storing information indicating second data bits of the second data having been flipped to enable the second data bits to be inverted before being output as a result of reading the specific row,
   wherein the second data bits include third data bits each having a first value and fourth data bits having a second value different from the first value.

2. The method of claim 1,
   wherein the concentrated activation is determined to occur when a number of times that the specific row is activated or a frequency at which the specific row is activated reaches a threshold value.

3. The method of claim 2, further comprising:
   decreasing the threshold value in response to determining that the concentrated activation continuously occurs at the specific row.

4. The method of claim 3, further comprising:
   initializing the threshold value to an initial value in response to determining that data bits stored in memory cells of at least one of neighbor rows of the specific row are refreshed.

5. The method of claim 2, further comprising:
   initializing the number of times that the specific row is activated or the frequency at which the specific row is activated, in response to determining that data bits stored in memory cells of at least one of neighbor rows of the specific row are refreshed.

6. The method of claim 1, further comprising:
   refreshing data bits stored in memory cells of neighbor rows adjacent to the specific row in response to determining that the concentrated activation occurs at the specific row.

7. The method of claim 1, further comprises: refreshing data bits stored in memory cells of neighbor rows adjacent to the specific row when the concentrated activation is determined to occur.

8. The method of claim 1, further comprising:
   receiving a write command and write data associated with at least some of the memory cells of the specific row; and
   selectively inverting the write data based on the information so as to be written in the at least some of the memory cells.

9. The method of claim 1, further comprising:
   receiving a read command associated with at least some of the memory cells of the specific row;
   reading data from the at least some of the memory cells; and
   selectively inverting and outputting the read data based on the information.

10. A semiconductor memory device comprising:
   pads configured to be connected with an external device;
   a memory cell array including memory cells arranged in rows and columns;
   a sense amplifier connected with the columns of the memory cells through bit lines;
   a row decoder connected with the rows of the memory cells through word lines;
   a buffer circuit connected between the sense amplifier and the pads; and
   control logic,
   wherein, in response to determining that an active command is received, the row decoder activates one of the rows of the memory cells, and the sense amplifier stores first data of memory cells of the activated row,
   wherein, in response to determining that concentrated activation occurs at the activated row, the control logic controls the semiconductor memory device such that a flipping is performed on first data bits of the first data stored in the sense amplifier to generate second data and write the second data to the memory cells of the activated row and that a storing of information is performed, the information indicating second data bits of the second data having been flipped to enable the second data bits to be inverted before being output as a result of reading the activated row, and wherein the second data bits include third data bits each having a first value and fourth data bits each having a second value different from the first value.

11. The semiconductor memory device of claim 10, wherein, in response to determining that a write command and write data are received, the control logic controls the semiconductor memory device such that the write data are selectively inverted based on the information and the selectively inverted write data are overwritten on at least some of data bits stored in the sense amplifier.

12. The semiconductor memory device of claim 10, wherein, in response to determining that a read command is received, the control logic controls the semiconductor memory device such that the sense amplifier or the buffer circuit inverts and outputs at least some of data bits stored in the sense amplifier based on the information.

13. The semiconductor memory device of claim 10, wherein, in response to determining that the concentrated activation occurs at the activated row, the row decoder and the sense amplifier perform a refresh operation with respect to a neighbor row adjacent to the activated row.

14. The semiconductor memory device of claim 10, wherein, in response to determining that the concentrated activation continuously occurs at the activated row, the control logic controls the semiconductor memory device so as to alternately perform a flip operation of flipping the first data bits and a refresh operation of memory cells of a neighbor row adjacent to the activated row.

15. The semiconductor memory device of claim 10, wherein, in response to determining that a number of times that the activated row is activated or a frequency at which the activated row is activated, the control logic detects that the concentrated activation occurs.

16. A memory system comprising:
a semiconductor memory device including memory cells arranged in rows and columns; and
a memory controller configured to transmit a row address and an active command to the semiconductor memory device,
wherein the semiconductor memory device activates a row corresponding to the row address from among the rows of the memory cells in response to the active command,
wherein the semiconductor memory device reads first data stored in memory cells of the activated row, flips first data bits of the first data to generate second data and writes the second data to the memory cells of the activated row, in response to determining that concentrated activation occurs at the activated row, and
wherein the semiconductor memory device stores information indicating second data bits of the second data having been flipped to enable the second data bits to be inverted before being output as a result of reading the activated row, and
wherein the second data bits include third data bits each having a first value and fourth data bits each having a second value different from the first value.

17. The memory system of claim 16, wherein, in response to receipt of a read command from the memory controller after the first data bits are flipped, the semiconductor memory device again flips the second data bits so as to be output to the memory controller.

18. The memory system of claim 16, wherein, in response to receipt of a write command from the memory controller after the first data bits are flipped, the semiconductor memory device flips the write data so as to be overwritten on the second data bits.

* * * * *